US007307343B2

(12) United States Patent
Kirner et al.

(10) Patent No.: US 7,307,343 B2
(45) Date of Patent: *Dec. 11, 2007

(54) LOW DIELECTRIC MATERIALS AND METHODS FOR MAKING SAME

(75) Inventors: John Francis Kirner, Orefield, PA (US); James Edward MacDougall, New Tripoli, PA (US); Brian Keith Peterson, Fogelsville, PA (US); Scott Jeffrey Weigel, Allentown, PA (US); Thomas Alan Deis, Vista, CA (US); Martin Devenney, Mountain View, CA (US); C. Eric Ramberg, San Jose, CA (US); Konstantinos Chondroudis, Sunnyvale, CA (US); Keith Cendak, Millbrae, CA (US)

(73) Assignee: Air Products and Chemicals, Inc., Allentown, PA (US)

( * ) Notice: Subject to any disclaimer, the term of this patent is extended or adjusted under 35 U.S.C. 154(b) by 137 days.

This patent is subject to a terminal disclaimer.

(21) Appl. No.: 10/158,511

(22) Filed: May 30, 2002

(65) Prior Publication Data
US 2003/0224156 A1 Dec. 4, 2003

(51) Int. Cl.
*H01L 23/48* (2006.01)
(52) U.S. Cl. ............ 257/758; 257/759; 257/642; 257/E23.145; 257/E21.547; 428/312.2; 428/312.6
(58) Field of Classification Search ........... 257/758, 257/506, E21.547
See application file for complete search history.

(56) References Cited

U.S. PATENT DOCUMENTS

| 5,905,117 A | 5/1999 | Yokotsuka et al. ......... 525/104 |
| 6,051,321 A * | 4/2000 | Lee et al. .................. 428/447 |
| 6,329,017 B1 | 12/2001 | Liu et al. ................... 427/240 |
| 6,329,107 B1 | 12/2001 | Lu et al. |
| 6,468,642 B1 * | 10/2002 | Bray et al. ................. 428/216 |
| 6,583,048 B1 | 6/2003 | Vincent et al. |
| 6,656,837 B2 * | 12/2003 | Xu et al. .................... 438/676 |

(Continued)

FOREIGN PATENT DOCUMENTS

EP 1088868 4/2001

(Continued)

OTHER PUBLICATIONS

Wang, S., et al., *Advanced Processing: CMP of Cu/low-K and Cu/ultralow-k layers*, Solid State Technol., Sep. 2001.

(Continued)

*Primary Examiner*—Tu-Tu Ho
(74) *Attorney, Agent, or Firm*—Rosaleen P. Morris-Oskanian

(57) ABSTRACT

Low dielectric materials and films comprising same have been identified for improved performance when used as interlevel dielectrics in integrated circuits as well as methods for making same. These materials are characterized as having a dielectric constant ($\kappa$) a dielectric constant of about 3.7 or less; a normalized wall elastic modulus ($E_0'$), derived in part from the dielectric constant of the material, of about 15 GPa or greater; and a metal impurity level of about 500 ppm or less. Low dielectric materials are also disclosed having a dielectric constant of less than about 1.95 and a normalized wall elastic modulus ($E_0'$), derived in part from the dielectric constant of the material, of greater than about 26 GPa.

58 Claims, 4 Drawing Sheets

U.S. PATENT DOCUMENTS

| | | | | |
|---|---|---|---|---|
| 6,759,133 | B2* | 7/2004 | Berry et al. | 428/446 |
| 6,846,515 | B2 | 1/2005 | Vrtis et al. | |
| 7,122,880 | B2* | 10/2006 | Peterson et al. | 257/632 |
| 2001/0018129 | A1* | 8/2001 | Shiota et al. | 428/447 |
| 2001/0038919 | A1 | 11/2001 | Berry, III et al. | |
| 2003/0141499 | A1* | 7/2003 | Venkatraman et al. | 257/40 |
| 2003/0232495 | A1* | 12/2003 | Moghadam et al. | 438/623 |

FOREIGN PATENT DOCUMENTS

| | | |
|---|---|---|
| EP | 1090967 | 4/2001 |
| EP | 1123753 | 8/2001 |
| EP | 1127929 | 8/2001 |
| EP | 1 142 832 A1 | 10/2001 |
| EP | 1 167 295 A1 | 2/2002 |
| JP | 2001-048977 | 2/2001 |
| JP | 2001-049179 | 2/2001 |
| JP | 2001-102377 | 4/2001 |
| JP | 2001-115021 | 4/2001 |
| JP | 2001-203197 | 7/2001 |
| JP | 2001-354901 | 12/2001 |
| JP | 2002-026003 | 1/2002 |
| JP | 2002-173641 | 6/2002 |
| JP | 2002-203848 | 7/2002 |
| JP | 2003-142476 | 5/2003 |
| JP | 2003-257963 | 9/2003 |
| WO | WO 99/23101 | 5/1999 |
| WO | WO0027254 | 5/2000 |
| WO | WO 01/70628 A2 | 9/2001 |
| WO | WO 01/70628 A3 | 9/2001 |

OTHER PUBLICATIONS

Lin, S., et al., *Low-k Dielectrics Characterization for Damascene Integration*, International Interconnect Technology Conference, Burlingame, CA, Jun. 2001.

Lu, Y., et al., *Evaporation-Induced Self-Assembly of Hybrid Bridged Silsesquioxane Film and Particulate Mesophases with Integral Organic Functionality*, J. Am. Chem. Soc. 2000, 122, 5258-5261.

Golden, J. H., et al., *Designing Porous Low-k Dielectrics*, Semiconductor International, May 2001.

Peters, L., Industry Divides on Low-k Dielectric Choices, Semiconductor International, Jul. 2001.

Jin, C., et al., *Characterization and Integration of Porous Extra Low-k (XLK) Dielectrics*, International Interconnect Technology Conference, San Francisco, CA, Jun. 2000.

Thomas, M. E., *Spin-on Stacked Films for Low-keff Dielectrics*, Solid State Technol., Jul. 2001.

Thanawala, S., et al., *Reduction in the Effective Dielectric Constant of Integrated Interconnect Structures Through an All-Spin-On Strategy*, Honeywell Technical Reports, unknown date.

Ramos, T., et al., *Mechanical and Electrical Properties of Nanoglass™ Nanoporous Silica as a Function of Porosity*, Honeywell Technical Report, date unknown.

Cook, R. F., et al., *Stress-Corrosion Cracking of Low-Dielectric-Constant Spin-On-Glass Thin Films*, J. Electrochem. Soc. 1999, 146(12), 4439-4448.

Ro, H. W., et al., *Synthesis and Characterization of Polysilsesquioxane Copolymers for Low Dielectric Applications*, Polymer Preprints 2001, 42(2), 889.

Yang, S., et al., *Molecular Templating of Nanoporous Ultralow Dielectric Constant (≈1.5) Organosilicates by Tailoring the Microphase Separation of Triblock Copolymers*, Chem. Mater. 2001, 13, 2762-2764.

Yang, S., et al., *Nanoporous Ultralow Dielectric Constant Organosilicates Templated by Triblock Copolymers*, Chem. Mater. 2002, 14, 369-374.

Lynn, J. L., et al., *Surfactants*, in Kirk-Othmer Encyclopedia of Chemical Technology, Copyright © 1997 by John Wiley & Sons, Inc. DOI: 10.1002/0471238961.1921180612251414.a01, Article Online Posting Date: Dec. 4, 2000.

Glass, J. E., *Water-Soluble Polymers*, in Kirk-Othmer Encyclopedia of Chemical Technology; John Wiley & Sons, Inc., 1988. DOI: 10.1002/0471238961.2301200507120119.a01. Article Online Posting Date: Dec. 4, 2000.

Brown, E, S., et al., *Glycols: Ethylene Glycol and Propylene Glycol*, in Kirk-Othmer Encyclopedia of Chemical Technology, $3^{rd}$ ed.; John Wiley & Sons: New York, 1980; vol. 11.p. 953.

Kingery, W. D., et al., *Introduction to Ceramics*, 2nd ed.; John Wiley: New York, 1976; pp. 947ff.

Kingery, W. D., et al., *Introduction to Ceramics*, 2nd ed.; John Wiley: New York, 1976; pp. 773ff.

Day, A.R., et al., *The Elastic Moduli of a Sheet Containing Circular Holes*, J. Mech. Phys. Solids 1992, 40, 1031-1051.

Ramos, T., et al., *Nanoporous Silica for Low K Dielectrics*, Mater. Res. Soc. Symp. Proc. 1997, 443, 91-98.

Bremmer, J. N., *A New Class of Insulating Materials: Emergence of Ultralow-K*, Solid State Technol., Sep. 2001.

Kingery, W. D., et al., *Introduction to Ceramics*, 2nd ed.; John Wiley: New York, 1976; equation 18.56, p. 948.

Oliver, W. C., *J. Mater. Res.* 1992, 7, 1564.

Brinker, et al., "Evaporation-Induced Self Assembly of Hybrid Bridged Silsesquioxane Film and Particulate Mesophases with Integral Organic Functionality", J. Am. Chem., Soc. 200, 122, pp. 5258-5261, May 2000.

Jin, et al., "Characterization and Integration of Porous Extra Low-k (XLK) Dielectrics", International Interconnect Technology Conference , Jun. 2001.

Wang, et al., "Advanced Processing: CMP of Cu/low-K and Cu/ultralow-K Layers", Solid State Technology, Sep. 2001.

Lapedus, M., "Startup Claims Radical Approach to Low-k Insulators in Copper Chips", Silicon Strategies, Apr. 5, 2002.

* cited by examiner

E vs. k plotted for various values of wall elastic modulus and wall k

LOW DIELECTRIC MATERIALS AND METHODS FOR MAKING SAME

BACKGROUND OF THE INVENTION

The present invention relates generally to materials suitable for use in electronic devices. More specifically, the invention relates to materials and films comprising same having an improved elastic modulus and a low dielectric constant expressed through a higher normalized wall elastic modulus and to methods for making same.

There is a continuing desire in the microelectronics industry to increase the circuit density in multilevel integrated circuit devices such as memory and logic chips in order to improve the operating speed and reduce power consumption. In order to continue to reduce the size of devices on integrated circuits, it has become necessary to use insulators having a low dielectric constant to reduce the resistance-capacitance ("RC") time delay of the interconnect metallization and to prevent capacitive crosstalk between the different levels of metallization. Such low dielectric materials are desirable for premetal dielectric layers and interlevel dielectric layers.

Typical dielectric materials for devices with 180 nm line width are materials with a dielectric constant between about 3.8 and 4.2. As the line width decreases, the dielectric constant should also be decreased. For example, devices with 130 nm line width require materials with a dielectric constant between about 2.5 and 3.0. Extremely low dielectric constant ("ELK") materials generally have a dielectric constant between about 2.0 and 2.5. Devices with 90 nm line width require materials with dielectric constants less than 2.4. According to the 2001 International Technology roadmap for Semiconductors (ITRS) interconnect roadmap, the projected dielectric constant requirements for interlevel metal insulators will be less than 2.1 for the 65 nm node, less than 1.9 for the 45 nm node, less than 1.7 for the 32 nm node, and less than 1.6 for the 22 nm node.

The dielectric constant (κ) of a material generally cannot be reduced without a subsequent reduction in the mechanical properties, i.e., modulus, hardness, toughness, of the material. Mechanical strength is needed for subsequent processing steps such as etching, CMP ("Chemical Mechanical Planarization"), and depositing additional layers such as diffusion barriers for copper, copper metal ("Cu"), and cap layers on the product. In some of these processes, temperature cycling of multiple layers may induce stresses due to the thermal coefficient of expansion mismatch between the different materials thereby causing cracking or delamination. Surface planarity is also required and may be maintained through controlling processing parameters such as those during the film formation process and also through CMP. Mechanical integrity, or stiffness, compressive, and shear strengths, may be particularly important to survive CMP. It has been found that the ability to survive CMP may be correlated with the elastic, or Young's, modulus of the material, along with other factors including polishing parameters such as the down force and platen speed. See, for example, Wang et al., "Advanced processing: CMP of Cullow-κ and Cu/ultralowκ layers", Solid State Technol., September, 2001; Lin et al., "Low-κ Dielectrics Characterization for Damascene Integration", International Interconnect Technology Conference, Burlingame, Calif., June, 2001. These mechanical properties are also important in the packaging of the final product.

A number of processes have been used for preparing low dielectric constant films. Chemical vapor depostion (CVD) and spin-on dielectric (SOD) processes are typically used to prepare thin films of insulating layers. Other hybrid processes are also known such as CVD of liquid polymer precursors and transport polymerization CVD. A wide variety of low κ materials deposited by these techniques have been generally classified in categories such as purely inorganic materials, ceramic materials, silica-based materials, purely organic materials, or inorganic-organic hybrids. Likewise, a variety of processes have been used for curing these materials to decompose and/or remove volatile components and substantially crosslink the films such as heating, treating the materials with plasmas, electron beams, or UV radiation.

Since the dielectric constant of air is nominally 1.0, one approach to reducing the dielectric constant of a material may be to introduce porosity. Porosity has been introduced in low dielectric materials through a variety of different means. A dielectric film when made porous may exhibit lower dielectric constants compared to a dense film, however, the elastic modulus of the film generally decreases with increasing porosity. Consequently, it may be impractical to use these low dielectric compositions due to the trade-off in dielectric constant with elastic modulus. Furthermore, it is often difficult to identify improved low dielectric compositions due to this trade-off in dielectric constant with elastic modulus.

The relationship between dielectric constant and porosity within a material has been approximated in numerous ways, see, for example, Kingery et al., Introduction to Ceramics, John Wiley & Sons, Inc., 1970, pp. 947-948 ("Kingery"), due to the difficulties in measuring the actual dielectric constant of the material. The physical models described in Kingery consider the dielectric material as a being a two-phase mixture of ideal dielectrics. For the purposes of approximating porosity, air having a dielectric constant of 1.0 may be viewed as one of the components of the mixture. These mixtures can be viewed in several ways. One way is to view the mixture as layers of materials having layers parallel to the capacitor plates. Another way is to view the layers of material as normal to the capacitor plates. Yet another way is to apply the logarithmic mixture rule which gives values intermediate between the parallel and normal extremes. In a still further way, Maxwell has derived a relationship for a dispersion of spherical particles in a matrix, which approaches the logarithmic mixture rule when the dispersed phase has a dielectric constant much higher than the matrix material, but very close to the normal layered model when the dispersed phase has a dielectric constant much lower than the matrix material.

Like the relationship with dielectric constant, the relationship between elastic modulus and porosity for a material comprising multiple phases has also been approximated in numerous ways, see, for example, Kingery at pp. 773-777. In two-phase systems, the overall modulus for a material that is a mixture falls between the elastic moduli of the low and high modulus components. Kingery describes a variety of different models, such as Voigt, Reuss, and Hashin and Shtrikman, which attempt to define the upper and lower bounds of moduli for a mixture. The extreme case in adding a low modulus material as a second phase to produce a mixture with pore spaces that have zero bulk modulus. In this case, MacKenzie has derived an expression to represent the change in elasticity for closed pores in a continuous matrix up to porosities of about 50%.

The reference, Day, et al., "The Elastic Moduli of a Sheet Containing Circular Holes", J. Mech. Phys. Solids, Vol. 40, No. 5, pp. 1031-51, 1992 ("Day"), describes a method using computer simulation techniques to obtain the elastic moduli of a matrix containing circular holes. Day applies the results of the simulation data for a regular array of circular holes in a triangular arrangement to an interpolation formula that incorporates the known results, i.e., the initial slope, the percolation concentration, and the critical exponent, as well as a free fitting parameter to obtain the relative Young's Modulus $E/E_0$, where E is the Young's modulus of the overall material, and $E_0$ is the Young's modulus of the matrix.

The reference Golden et al., "Designing Porous Low-κ Dielectrics", Semiconductor International, May 2001 ("Golden"), describes applying the Bruggeman effective medium approximation model to predict the effect of porosity on dielectric constant. The Bruggeman model predicts that a host matrix with a lower κ value than $SiO_2$ would need less porosity to achieve the lowest target κ value. For example, up to 50% porosity is needed to obtain κ=2.0 starting from a matrix material having a κ=4.2 (the value for dense silica) whereas only 22% porosity is needed in a κ=2.5 matrix material. Less porosity may be better for maintaining mechanical properties if the mechanical properties of the dense oxide and the κ=2.5 material are equivalent. Realistically, however, the elastic modulus for the κ=2.5 material is lower than the elastic modulus of the dense oxide. Although the modulus of the κ=2.5 material is not decreased in the same amount by the introduction of 22% porosity as is the modulus of the dense oxide by the introduction of 50% porosity, if the modulus of the κ=2.5 material is low to begin with, the overall modulus after the introduction of 22% porosity could be lower than the overall modulus of the dense oxide after the introduction of 50% porosity. Consequently, it is unclear which of the two materials at a κ=2.0 will have better mechanical properties. This is a critical failing in the prior art: the inability to understand and quantify the trade-off between κ and modulus to be able to identify a material with improved performance.

Some designers of low dielectric materials have attempted to correlate the relationship between dielectric constant, elastic modulus, and porosity in order to achieve a low dielectric material with good mechanical properties. The reference, Ramos et al., "Mechanical and Electrical Properties of NANOGLASS™ Nanoporous Silica as a Function of Porosity" ("Ramos"), found on the website www.honeywell.com, discloses that the modulus for the NANO-GLASS™ materials varies proportional to $(\kappa-1)^x$ where x=2.5. The κ for these materials was adjusted by changing the amount of solvent. However, these results were empirically derived for a given set of materials and are not generally extendible to other classes of materials.

The reference, Bremmer, "A New Class of Insulating Materials: Emergence of ultralow-κ", Solid State, Technology, September 2001 ("Bremmer"), describes two-component models to approximate properties of porous dielectric materials. The dielectric constant was predicted using a two-phase parallel capacitance model and the modulus of elasticity was approximated by a power function of film porosity. Bremmer provides plots of E vs. κ for 3 different porous materials and dense silica that typify the matrix materials. Bremmer did not provide the values for $E_{matrix}$, $\kappa_{matrix}$, and m, the power coefficient to approximate E degradation. Further, Bremmer did not teach that one value, or figure of merit, could be used to characterize each E vs. κ curve.

Another consideration in the production of low dielectric materials and the resultant film is the level of metal impurities present in the material. In order for a low dielectric film to be suitable for Integrated Circuit (IC) fabrication, it is desirable that the film has a controlled level of impurities. In other words, the film should be deposited using ingredients that have minimal levels of nonvolatile impurities that may be harmful in silicon oxide-based insulator films in microelectronic devices. In the IC industry, it is well known that alkali metal ions such as sodium and potassium should be excluded from silicon dioxide films used as metal oxide semiconductor ("MOS") transistor insulators and multilevel interconnection insulators. These positively charged ions might become mobile when exposed to electric fields and drift away from the positively biased film interface and toward the negatively biased film interface causing capacitance-voltage shifts.

Some commercially available chemical reagents used in the production of low dielectric films contain alkali metal impurities. These impurities may result from residual levels of catalyst used in the manufacture of the chemical precursor reagents. Ratios of 0.005-0.05:1 mol of NaOH, KOH, or $NaOCH_3$ to alcohol are frequently used in the base-catalyzed ethoxylation of aliphatic alcohols, alkylphenols, and fatty acids. See, e.g., Lynn et al., "Surfactants", Kirk-Othmer Encyclopedia of Chemical Technology, John Wiley & Sons, Inc., (1997). For example, the use of 0.005 mol NaOH per mol of alcohol in the production of TRITON™ X-114, an alklyphenol ethoxylate with an average 7.5 moles of ethoxylate per mole of alcohol, may result in 214 ppm of sodium in the final product. Such levels of residual catalytic impurities are often of little consequence in typical applications of these chemicals because the surfactant is often used at such low levels that the catalytic impurities imparted by the surfactant become insignificant in the final formulation. A polymer such as polyethylene glycol (PEG) may be made using different catalyst systems depending on the desired molecular weight. For molecular weight below 20,000, base or the $Na^+$ or $K^+$ alkoxides of methanol or butanol are used as the catalyst. See, for instance, Glass, J. E. "Water-Soluble Polymers", Kirk-Othmer Encyclopedia of Chemical Technology, John Wiley & Sons, Inc. (1988). Solvents, like surfactants, can also contain residual catalytic impurities. For instance, the formation of ethers, such as propylene glycol propyl ether (PGPE), through the reaction of propylene oxide with an alcohol, is often base-catalyzed when high selectivity to the primary alkyl ether over the secondary ether is desired which can result in residual impurities. See, for instance, Brown, et al., "Glycols: Ethylene Glycol and Propylene Glycol", Kirk-Othmer Encyclopedia of Chemical Technology, 3rd ed., John Wiley & Sons, N.Y., (1980), Vol. 11, p 953. A further source of impurities may result from an inattention to detail, such as packaging or handling outside a clean room, because such stringent purity requirements are not needed for typical applications.

Alkali metal impurity specifications for chemical precursor solutions for integrated circuit applications typically set the allowable impurity levels to approximately 20 parts per billion maximum for each type of alkali metal and less than 50 ppb total. To meet these limits, the material supplier to the IC industry may purify the surfactants. The reference, EP 1,142,832, assigned to the assignee of the present application, discusses how the dielectric and mechanical properties of the resulting films may be adversely affected by the purification of surfactants used as porogens in the film-forming mixture. The reference, US 2002/0045693, discusses how the dielectric properties of the resulting films may be adversely affected by the purification of reagents even if surfactant is not present.

Yet another concern in the production of low dielectric films is the processing or cycle time. The cure or anneal step, in which the coated substrate is typically heated to decompose and/or remove volatile components and substantially cross-link the film, is a significant source of production bottlenecks. The majority of low and ultralow dielectric films currently made have a cure step which ranges from greater than 30 minutes to 2 hours. Consequently, reduction of the cure step time would reduce the overall process time and achieve higher manufacturing throughput.

Another concern is the overall thermal budget. Various components of IC devices such as Cu metal lines can only be subjected to processing temperatures for short time periods before their performance deteriorates due to undesirable diffusion processes. Most processes for preparing silica-based low κ films require curing steps at temperatures of 450° C. or higher and times of 30 minutes or longer. Significant advantages could result if the curing step could be carried out at significantly lower temperatures and or shorter times.

Accordingly, there is a need in the art to provide improved dielectric materials having low dielectric constant and sufficient mechanical strength. To achieve that end, there is also a need in the art to provide a means to correlate dielectric constant, porosity, and elastic modulus to identify and develop low dielectric materials. There is also a need in the art to provide dielectric materials and films that have relatively low metal content yet still maintain the beneficial properties, i.e., lower κ and higher modulus, that high levels of metals may impart. Further, there is a need in the art to provide processes for making low dielectric films at relatively low temperatures and relatively short cycle times.

All references cited herein are incorporated herein by reference in their entirety.

BRIEF SUMMARY OF THE INVENTION

The present invention satisfies these needs in the art by relating two measured attributes, dielectric constant and elastic modulus, into one figure of merit, the normalized wall elastic modulus ($E_0'$), that can be used to identify and develop improved low dielectric materials having a low dielectric constant yet sufficient mechanical strength. In this connection, materials with substantially identical normalized wall elastic modulus values belong to a family of materials whose dielectric constant and elastic modulus can be adjusted by varying the porosity. Thus, once an improved dielectric material is identified, i.e. one with a higher normalized wall elastic modulus, the target dielectric constant can be obtained by varying the porosity.

The present invention is directed, in part, to low dielectric materials and thin dielectric films comprising the same. Specifically, in one embodiment, there is provided a dielectric material having a dielectric constant of about 3.7 or less; a normalized wall elastic modulus ($E_0'$), derived in part from the dielectric constant of the material, of about 15 GPa or greater; and a metal impurity level of about 500 ppm or less. In certain embodiments of the present invention, the material comprises a plurality of Si—C bonds.

A further aspect of the present invention is directed to a low dielectric material having a dielectric constant of less than about 1.95 and a normalized wall elastic modulus ($E_0'$), derived in part from the dielectric constant of the material, of greater than about 26 GPa. In one embodiment, the dielectric material is porous.

A still further aspect of the present invention is a low dielectric material having a dielectric constant of less than about 2.0, a normalized wall elastic modulus ($E_0'$), derived in part from the dielectric constant of the material, that ranges from between about 5 GPa to about 15 GPa, and a metal impurity level of about 500 ppm or less. In one embodiment, the dielectric material is porous. In a particular embodiment of the present invention, the material does not exhibit a diffraction peak at a d-spacing greater than 10 Angstroms.

Another aspect of the present invention is directed to a method for preparing a low dielectric film having a dielectric constant of about 3.7 or less and a normalized wall elastic modulus ($E_0'$), derived in part from the dielectric constant of the material, of about 15 GPa or greater. In one embodiment, there is provided a process for preparing the film comprising: providing a mixture comprising the product from the hydrolysis and condensation of at least one silica source and at least one porogen wherein the mixture has a metal impurity content of about 500 ppm or less; dispensing the mixture onto a substrate to form a coated substrate; and curing the coated substrate to one or more temperatures and for a time sufficient to form a dielectric film. In certain embodiments of the present invention, the curing step is conducted at a temperature of no greater than about 450° C. and for a time of about 30 minutes or less.

Yet another aspect of the present invention is directed to a method for preparing a low dielectric film. In one embodiment, there is provided a process for preparing the film comprising: providing a first film made from a mixture comprising at least one porogen and a product from the hydrolysis and condensation of at least one silica source; measuring the elastic modulus value and the dielectric constant value of the first film; calculating a void fraction value of the first film from the dielectric constant; determining the normalized wall elastic modulus of the first film from the elastic modulus and void fraction values; and adjusting the void fraction value for a second film to increase or decrease the elastic modulus of the second film wherein the increased or decreased elastic modulus is accompanied by an increase or a decrease in the dielectric constant of the second film, the second film having substantially the same normalized elastic modulus as the first film.

Still another aspect of the present invention is a low dielectric material comprising: at least one silica having a plurality of Si—C bonds wherein the total number of the Si—C bonds to the total number of Si atoms ranges from about 20 to about 80 mole percent; an elastic modulus that ranges from about 0.5 to about 6.5 GPa; a dielectric constant of about 2.5 and below; and a metal impurity level of about 500 ppm or less.

Yet a further aspect of the present invention is a low dielectric material comprising: at least one silica having a plurality of Si—C bonds wherein the total number of the Si—C bonds ranges from about 20 to about 80 mole percent; an elastic modulus that ranges from about 1.3 to about 6.5 GPa; and a dielectric constant of about 1.95 and below.

A further aspect of the present invention is directed to a method for preparing a low dielectric film having a dielectric constant of about 3.7 or less and a normalized wall elastic modulus ($E_0'$), derived in part from the dielectric constant of the material, of about 15 GPa or greater. In one embodiment, there is provided a process for preparing the film comprising: providing a mixture comprising the product from the hydrolysis and condensation of at least one silica source and at least one porogen; dispensing the mixture onto a substrate to form a coated substrate; and curing the coated substrate to one or more temperatures no greater than about 450° C. and for a time sufficient to form a dielectric film.

A still further aspect of the present invention is directed to a method for preparing a low dielectric film having a dielectric constant of less than about 2.0, a normalized wall elastic modulus ($E_0'$), derived in part from the dielectric constant of the material, that ranges from between about 5 GPa to about 15 GPa. In one embodiment, there is provided a process for preparing the film comprising: providing a mixture comprising the product from the hydrolysis and condensation of at least one silica source and at least one porogen; dispensing the mixture onto a substrate to form a coated substrate; and curing the coated substrate to one or more temperatures and for a time sufficient to form a dielectric film.

These and other aspects of the invention will become apparent from the following detailed description.

DETAILED DESCRIPTION OF THE INVENTION

Figure 1:
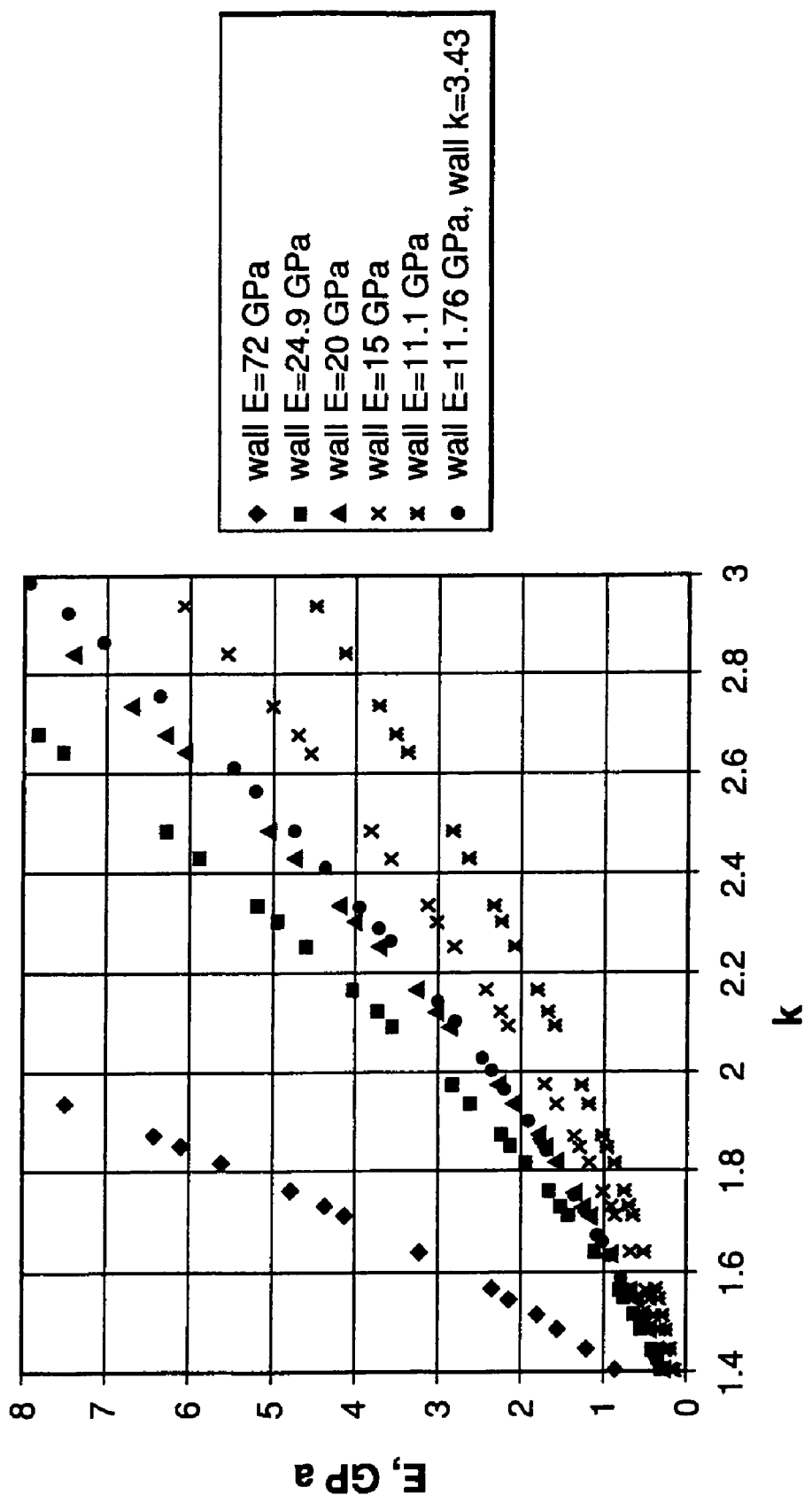
FIG. 1 provides a comparison of E vs. κ for various values of wall elastic modulus and wall κ.

The present invention is directed to low dielectric materials and films comprising same. Two measured attributes of a low dielectric material, dielectric constant and elastic modulus, are correlated into one figure of merit, the normalized wall elastic modulus ($E_0'$), that can be used to identify and develop improved low dielectric materials. Improved dielectric materials are materials having a low dielectric constant yet high enough elastic modulus to tolerate subsequent processing steps such as etching and CMP processes. In this connection, materials with substantially identical normalized wall elastic modulus values belong to a family of materials whose dielectric constant and elastic modulus can be adjusted by varying the porosity. Thus, once an improved dielectric material is identified, i.e. one with a higher normalized wall elastic modulus, the target dielectric constant can be obtained by varying the porosity. Moreover, the dielectric materials of the present invention have relatively low metal content and allow for ease of manufacture in comparison to other materials in the art.

The term "normalized wall elastic modulus", as used herein, is the wall elastic modulus of a material that is normalized to a wall with a dielectric constant of 4.2, which is the dielectric constant of a $SiO_2$ dense oxide material. Once the dielectric constant (κ) and the elastic modulus (E) of a material are measured, the normalized wall elastic modulus ($E_0'$) can be calculated. The $E_0'$ of the material is calculated using Maxwell's relationship for mixed dielectrics applied to porous materials, the measured value for dielectric constant (κ), a wall $κ_{SiO2}$ of 4.2, Day's 2-d circular hole model for elastic modulus extended to 3-d cylindrical pores with the modulus measured perpendicular to the pore axes, and the measured value for E. While the derivation for the normalized wall elastic modulus is based upon cylindrical pores in the extension of the Day model and spherical inclusions in the Maxwell model, it is anticipated that other types and forms or porosity, i.e., non-cylindrical, open porosity, closed porosity, etc., would fall within the scope of the present invention.

A void fraction value is first calculated from the Maxwell equation using the observed value for κ of the material and a value for the wall κ of 4.2, or the dielectric constant of dense, amorphous silica. The dielectric constant of the material is preferably less than 4.2 since $κ_{SiO2}$ is 4.2. The Maxwell equation was rearranged to solve for porosity or void fraction, as a function of measured κ and wall κ, as provided in Equation (1);

$$\chi_p = \frac{\left[\frac{2}{3} + \frac{1}{3 \times \kappa_{SiO2}}\right] \times (\kappa_{SiO2} - \kappa)}{\left[\frac{2}{3} + \frac{1}{3 \times \kappa_{SiO2}}\right] \times (\kappa_{SiO2} - \kappa) + \kappa - 1} \quad \text{Equation (1)}$$

where:
$κ_{SiO2}$=4.2
$χ_p$=void fraction value
κ=measured value of dielectric constant The normalized wall elastic modulus may then be calculated based on Day's 2-d circular hole model for elastic modulus using Equation (2). The equation is valid for void fractions less than $q_c$, the critical porosity at which the pores touch, and beyond which the modulus is predicted to be zero. For materials with a wall κ of 4.2, this determines a minimum κ value=1.23 for composites with E>0.

Day et al. 2-d circular hole model:

$$\frac{E_{2d}^*}{E_0} = \left[\left(\frac{1 - q/q_c}{1 + q/mq_i}\right)\left(1 + \frac{q}{q_c} + \alpha\theta\left(\frac{q}{q_c}\right)^2 + \alpha(1-\theta)\left(\frac{q}{q_c}\right)^3\right)\right]^m \quad \text{Equation (2)}$$

where
q=void fraction
$q_c$=0.9069=percolation threshold, void fraction at which circles overlap and modulus goes to zero
$q_i$=⅓=initial slope
m=1.5=critical exponent
α=−0.251=parameter to get correct critical amplitude
θ=−1.83=free fitting parameter The Day 2-d circular hole model for elastic modulus is extended to 3-d cylindrical pores with the modulus measured perpendicular to the pore axes as provided in the Equation (3). The normalized wall elastic modulus can be calculated using the calculated void fraction value from Equation (1), the elastic modulus for 2-d circular holes from Equation (2), the observed value for E, and a value for Poisson's ratio (ν) of 0.25.

3-d extension perpendicular to the cylinders:

$$\frac{E_0}{E_{3d\perp}^*} = \frac{v^2}{1-q} + \frac{1-v^2}{E_{2d}^*/E_0} \quad \text{Equation (3)}$$

where
ν=Poisson's ratio=0.25
q=void fraction
$E_0$=wall elastic modulus

When q is set equal to the void fraction value $\chi_p$ obtained from the measured value of κ and Equation (1), and $$E^*_{3d\perp}$$

is set equal to the measured value of elastic modulus, E, then $E_0$ becomes $E_0'$, the normalized wall elastic modulus, giving the following equation, Equation (4), for $E_0'$:

$$E'_0 = E \times \left[\frac{v^2}{1-q} + (1-v^2) \times \left[\left(\frac{1-q/q_c}{1+q/mq_l}\right)\left(1 + \frac{q}{q_c} + \alpha\theta\left(\frac{q}{q_c}\right)^2 + \alpha(1-\theta)\left(\frac{q}{q_c}\right)^3\right)\right]^{-m}\right]$$

Equation (4)

In order to better understand the value of using $E_0'$ to characterize low dielectric constant films, it is instructive to consider curves of E vs. κ that can be generated as a function of porosity using the two physical models. FIG. 1 provides the elastic modulus vs. κ for materials having different porosity or void fractions for various values of wall elastic modulus. The modulus was calculated for different void fractions with a wall elastic modulus $E_0$=72 GPa, the elastic modulus for dense silica, and a value for Poisson's ratio (ν) of 0.25 using Equations (2) and (3). Dielectric constant was calculated using Equation (5) for different void fractions using Maxwell's equation for porous materials with a wall dielectric constant equal to that of dense silica, $\kappa_{SiO2}$=4.2.

$$\kappa = \frac{\left[(1-\chi_P) \times \kappa_{SiO2} \times \left[\frac{2}{3} + \frac{1}{3 \times \kappa_{SiO2}}\right]\right] + \chi_P}{\left[(1-\chi_P) \times \left[\frac{2}{3} + \frac{1}{3 \times \kappa_{SiO2}}\right]\right] + \chi_P}$$

Equation (5)

where
$\kappa_{SiO2}$=4.2
$\chi_p$=void fraction

FIG. 1 further provides theoretical curves calculated with a wall κ=4.2 and with several different values for wall E, including wall E equal to 15 and 20. The theoretical curve for wall E equal to 72 GPa approximates the wall E for dense silica. Materials prepared by sol-gel chemistry often do not show the values for dense silica, particularly if they are not heated to temperatures above 1000° C. Therefore, elastic modulus data for spin-on films prepared from tetraethoxysilane ("TEOS") (E=24.9 GPa) and TEOS/methyltriethoxysilane ("MTES") (E=11.1 GPa) were added to provide the modulus attainable using the standard condensation technology, limited to densification temperatures around 400° C. These values also give an indication of reasonable values for the wall modulus if porosity were introduced into these films.

FIG. 1 also includes a theoretical curve for wall E equal to 11.1 GPa and wall κ equal to 3.43. The dielectric constant measured on the TEOS/MTES film without using surfactant, or a relatively dense TEOS/MTES film, is 3.43. This curve is included to show that, like the wall modulus, the wall κ of sol-gel films with incorporated porosity might be lower than the wall κ of dense silica with incorporated porosity. As FIG. 1 illustrates, the shape of the curve for wall E equal to 11.76 GPa and wall κ equal to 3.43 is similar to the shape of the curve for wall E equal to 20 GPa and wall κ equal to 4.2. Based upon this, it appears that regardless of the inherent wall modulus and dielectric constant that define a curve, a value can be found for wall E with a wall κ equal to 4.2 that provide essentially the same curve. Therefore, it is possible to define a normalized wall elastic modulus that represents all combinations of wall E and wall κ that give the same curve as the theoretical wall elastic modulus with a κ of 4.2. Thus, the two measured attributes, dielectric constant and elastic modulus, of a material are combined into a single value. Using this information, one can then tailor a material with beneficial dielectric constant and elastic modulus properties simply by adjusting the void fraction of the material.

The low dielectric materials have a dielectric constant of about 3.7 or less, preferably about 2.7 or less, and more preferably less than 1.95. The materials of the present invention also have a normalized wall elastic modulus ($E_0'$), derived in part from the dielectric constant of the material, of about 15 GPa or greater, preferably about 20 GPa or greater, and more preferably greater than about 26 GPa. Further, in some embodiments of the present invention, the materials have alkali impurity levels less than about 500 ppm. In other embodiments of the present invention, the materials may have a dielectric constant of about 2.0 or less, a normalized wall elastic modulus that ranges from between about 5 GPa to about 15 GPa, and have a metal impurity level of less than about 500 ppm.

The materials of the present invention may be formed into films from a precursor composition or mixture using a variety of different methods. Some examples of processes that may be used to form the film include plasma enhanced chemical vapor deposition ("PECVD"), high density PECVD, photon assisted CVD, plasma-photon assisted ("PPECVD"), CVD of a liquid polymer precursor, or transport polymerization ("TP"). U.S. Pat. Nos. 6,171,945 and 6,054,206 provide some exemplary CVD methods that may be used with the present invention. Other processes that can be used to form the film include spin on deposition methods. In certain embodiments of the present invention, non-contact induced spreading forces such as the process described in pending U.S. patent application Ser. No. 10/158,375 entitled "Apparatus and Methods for Forming Films on Substrates", may be used to apply the mixture, which is incorporated herein by reference in its entirety. Further related processes may be used to apply the mixture include oscillating non-contact induced spreading forces, gravity-induced spreading forces, wetting-induced spreading forces, or combinations thereof.

The materials of the present invention preferably comprise silica. The term "silica", as used herein, is a material that has silicon (Si) and oxygen (O) atoms, and possibly additional substituents such as, but not limited to, other elements such as H, B, C, P, or halide atoms; alkyl groups; or aryl groups. In certain preferred embodiments, the material may further comprise silicon-carbon bonds having a total number of Si—C bonds to the total number of Si atoms ranging from between about 20 to about 80, and more preferably from between about 40 to about 60 mole percent.

The film of the present invention is formed from a mixture. The mixture comprises the film matrix material, a porogen, and other additives that vary depending which formation process is used. In preferred embodiments, the matrix material comprises at least one silica source. However, the matrix may comprise other materials such as, but not limited to, polymers, hybrid materials, zeolites, or polyborazylenes. Depending upon the film formation method, the mixture may be applied to a substrate as a liquid, vapor, or aerosol of the mixture.

As mentioned previously, the mixture generally comprises the matrix material, preferably a silica-containing matrix material, a porogen, and water. The mixture may further include other constituents such as, but not limited to, surfactants, solvents, and/or ionic additives. The weight ratio of weight of surfactant to the weight of surfactant and weight of $SiO_2$ ranges from 0.85 to 0.1, more preferably 0.75 to 0.2. The weight of $SiO_2$ is calculated from the total number of moles of silicon introduced by the silica sources. This is not meant to imply that the silica sources are completely converted to $SiO_2$. The weight ratio of solvent to silica is about 30:1 wherein the solvent may include water. The weight ratio of base to weight of surfactant is 0.5 to 0. The molar ratio of R, or organic constituents, to Si ranges from 2 to 0. The molar ratio of water to OR, where OR is an organic group bridged to silicon through an oxygen atom, e.g. ethoxy functionality on TEOS, ranges from 40 to 1.

The mixture employs chemicals that meet the requirements of the electronics industry because they do not contain contaminants which reduce the efficiency of preparation of integrated circuits. Constituents like halogen-containing mineral acids, cationic surfactants with halide counter ions, and anionic surfactants with alkali metal counter ions are preferably avoided in the mixture because they may contribute undesirable counter ions to the materials of the invention. The mixtures of the present invention preferably contain contaminating metals in amounts less than 500 parts per million ("ppm"), preferably less than 100 parts per billion ("ppb"), and more preferably less than 10 ppb. Consequently, materials of the invention may preferably contain contaminating metals in amounts less than 500 parts per million ("ppm"), preferably less than 100 parts per billion ("ppb"), and more preferably less than 10 ppb. Materials of the invention preferably contain contaminating halides in amounts less than 1 ppm, preferably less than 750 ppb, and more preferably less than 500 ppb.

As mentioned previously, the mixture preferably comprises at least one silica source. A "silica source", as used herein, is a compound having silicon (Si) and oxygen (O), and possibly additional substituents such as, but not limited to, other elements such as H, B, C, P, or halide atoms; alkyl groups; or aryl groups. The term "alkyl" as used herein includes straight chain, branched, or cyclic alkyl groups, preferably containing from 1 to 24 carbon atoms, or more preferably from 1 to 12 carbon atoms. This term applies also to alkyl moieties contained in other groups such as haloalkyl, alkaryl, or aralkyl. The term "alkyl" further applies to alkyl moieties that are substituted. The term "aryl" as used herein six to twelve member carbon rings having aromatic character. The term "aryl" also applies to aryl moieties that are substituted. The at least one silica source may include materials that have a high number of Si—O bonds, but can further include Si—O—Si bridges, Si—R—Si bridges, Si—C bonds, SiF bonds, Si—H bonds or a portion of the material can also have C—H bonds. It is preferred that at least one silica source have a minimum of Si—OH bonds. The at least one silica source may further include residual elements from processing, such as organics, that were not removed after formation.

Other examples of the at least one silica source may include a fluorinated silane or fluorinated siloxane such as those provided in U.S. Pat. No. 6,258,407.

Another example of at least one silica source may include compounds that produce a Si—H bond upon elimination.

Still further examples of the at least one silica source are found in the the non-hydrolytic chemistry methods described, for example, in the references Hay et al., "Synthesis of Organic-Inorganic Hybrids via the Non-hydrolytic Sol-Gel Process", Chem. Mater., 13, 3396-3403 (2001) or Hay, et al., "A Versatile Route to Organically-Modified Silicas and Porous Silicas via the Non-Hydrolytic Sol-Gel Process", J. Mater. Chem., 10, 1811-1818 (2000).

Yet another example of at least one silica source may include colloidal silica, fumed silica, or silicic acid starting materials.

Still other examples of silica sources include silsesquioxanes such as hydrogen silsesquioxanes (HSQ, $HSiO_{1.5}$) and methyl silsesquioxanes (MSQ, $RSiO_{1.5}$ where R is a methyl group). Further examples of the suitable silica sources include those described in U.S. Pat. No. 6,271,273 and EP Nos. 1,088,868; 1,123,753, and 1,127,929. In preferred embodiments, the silica source may be a compound represented by the following: $R_a Si(OR^1)_{4-a}$, wherein R represents a hydrogen atom, a fluorine atom, or a monovalent organic group; $R^1$ represents a monovalent organic group; and a is an integer of 1 or 2; $Si(OR^2)_4$, where $R^2$ represents a monovalent organic group; or $R^3{}_b(R^4O)_{3-b}Si—(R^7)_d—Si(OR^5)_{3-c}R^6{}_c$, wherein $R^3$ to $R^6$ may be the same or different and each represents a monovalent organic group; b and c may be the same or different and each is a number of 0 to 2; $R^7$ represents an oxygen atom, a phenylene group, or a group represented by —$(CH_2)_n$—, wherein n is an integer of 1 to 6; and d is 0 or 1; or combinations thereof. The term "monovalent organic group" as used herein relates to an organic group bonded to an element of interest, such as Si or O, through a single C bond, i.e., Si—C or O—C.

In preferred embodiments, a combination of hydrophilic and hydrophobic silica sources is used in the mixture. In preferred embodiments, the ratio of hydrophobic silica source to the total amount of silica source is approximately 20-80 molar percent, and more preferably, 40-60 molar percent. The term "hydrophilic", as used herein, refers to compounds that can crosslink through four bridges. Some examples of hydrophilic sources include alkoxysilanes having an alkoxy functionality and can at least partially crosslink, i.e. a Si atom with four methoxy, ethoxy, propoxy, acetoxy, etc. groups, or materials with carbon or oxygen bridges between Si atoms and all other functionality on the Si atoms being an alkoxide. If the Si atoms do not fully crosslink, residual Si—OH groups may be present as terminal groups that can adsorb water. The term hydrophobic source refers to compounds where at least one of the alkoxy functionalities has been replaced with a terminal Si—C or Si—F bond, i.e. Si-methyl, Si-ethyl, Si-phenyl, Si-cyclohexyl, etc., that would not generate a hydroxyl after hydrolysis. In these sources, the silicon would crosslink with less than four bridges even when fully crosslinked if the terminal group remains intact. In certain preferred embodiments, the hydrophobic silica source contains a methyl group attached to silicon. Under certain processing conditions, terminal organic groups may undergo beta hydride elimination to form Si—H bonds that may be oxidized to Si—OH and result in Si—O—Si bridges and/or residual Si—OH within the compound. In this instance, these silica sources would be acting as hydrophilic silica sources.

The at least one silica source may be added to the mixture as the product of hydrolysis and condensation. Hydrolysis and condensation of the silica source occurs by adding water and a catalyst to a solvent and adding the silica source at a time, intermittently or continuously, and conducting hydrolysis and condensation reactions while stirring the mixture at a temperature range generally from −30 to 100° C., preferably from 20 to 100° C., for 0 to 24 hours. The composition can be regulated to provide a desired solid content by conducting concentration or dilution with the solvent in each step of the preparation. In certain preferred embodiments, the at least one silica source is one or more sources that generates acetic acid when hydrolyzed.

The hydrolysis and condensation of the silica source can occur at any point during the formation of the film, i.e., before adding to the mixture, after adding to the mixture, prior to or during curing, etc. For example, in certain embodiments of the present invention, the at least one silica source is combined with the solvent, water, and surfactant in a first vessel, the ionic additive and catalyst are combined in a second vessel, and the contents of the second vessel are gradually added to the first vessel and mixed. It is envisioned that a variety of different orders of addition to the mixture can be used without departing from the spirit of the present invention.

The catalyst suitable for the present invention includes any organic or inorganic acid or base that can catalyze the hydrolysis of substitutents from the silica source in the presence of water, and/or the condensation of two silica sources to form an Si—O—Si bridge. The catalyst can be an organic base such as, but not limited to, quaternary ammonium salts and hydroxides, such as ammonium or tetramethylammonium, amines such as primary, secondary, and tertiary amines, and amine oxides. The catalyst can also be an acid such as, but not limited to, nitric acid, maleic, oxalic, acetic, formic, glycolic, glyoxalic acid, or mixtures thereof. In preferred embodiments, the catalyst comprises nitric acid.

Solvents that are suitable for the use in the present invention may include any solvents that exhibit solubility with the reagents. Solvents can be alcohol solvents, ketone solvents, amide solvents, or ester solvents. In certain embodiments, one or more solvents used in the present invention have relatively low boiling points, i.e., below 160° C. These solvents include, but are not limited to, tetrahydrofuran, acetone, 1,4-dioxane, 1,3-dioxolane, ethyl acetate, and methyl ethyl ketone. Other solvents, that can be used in the present invention but have boiling points above 160° C., include dimethylformamide, dimethylacetamide, N-methyl pyrrolidone, ethylene carbonate, propylene carbonate, glycerol and derivatives, naphthalene and substituted versions, acetic acid anyhydride, propionic acid and propionic acid anhydride, dimethyl sulfone, benzophenone, diphenyl sulfone, phenol, m-cresol, dimethyl sulfoxide, diphenyl ether, terphenyl, and the like. Preferred solvents include propylene glycol propyl ether (PGPE), 3-heptanol, 2-methyl-1-pentanol, 5-methyl-2-hexanol, 3-hexanol, 2-heptano, 2-hexanol, 2,3-dimethyl-3-pentanol, propylene glycol methyl ether acetate (PGMEA), ethylene glycol n-butyl ether, propylene glycol n-butyl ether (PGBE), 1-butoxy-2-propanol, 2-methyl-3-pentanol, 2-methoxyethyl acetate, 2-butoxyethanol, 2-ethoxyethyl acetoacetate, 1-pentanol, and propylene glycol methyl ether. Still further exemplary solvents include lactates, pyruvates, and diols. Further exemplary solvents include those solvents listed in EP 1,127,929. The solvents enumerated above may be used alone or in combination of two or more solvents. In preferred embodiments, the solvent may comprise one or more solvents with relatively low boiling points, i.e., boiling points below 160° C.

The mixture used to form the films of the present invention further comprises a porogen. A "porogen", as used herein, is a reagent that is used to generate void volume within the resultant film. Suitable porogens for use in the dielectric materials of the present invention include labile organic groups, solvents, decomposable polymers, surfactants, dendrimers, hyper-branched polymers, polyoxyalkylene compounds, or combinations thereof.

In certain embodiments of the present invention, the porogen may include labile organic groups. When some labile organic groups are present in the reaction mixture, the labile organic groups may contain sufficient oxygen to convert to gaseous products during the cure step. In yet other embodiments of the present invention, a film is deposited via CVD from a mixture comprising the labile organic groups with a peroxide compound followed by thermal annealing. Some examples of compounds containing labile organic groups include the compounds disclosed in U.S. Pat. No. 6,171,945, which is incorporated herein by reference in its entirety.

In some embodiments of the present invention, the porogen may be a solvent. Solvents suitable for the present invention may be any of the solvents previously mentioned. In this connection, the solvent is generally present during at least a portion of the cross-linking of the matrix material. Solvents typically used to aid in pore formation have relatively higher boiling points, i.e., greater than 200° C.

In certain embodiments, the porogen may be a small molecule such as those described in the reference Zheng, et al., "Synthesis of Mesoporous Silica Materials with Hydroxyacetic Acid Derivatives as Templates via a Sol-Gel Process", J. Inorg. Organomet. Polymers, 10, 103-113 (2000).

The porogen could also be a decomposable polymer. The decomposable polymer may be radiation decomposable, or more preferably, thermally decomposable. The term "polymer", as used herein, also encompasses the terms oligomers and/or copolymers unless expressly stated to the contrary. Radiation decomposable polymers are polymers that decompose upon exposure to radiation, e.g., ultraviolet, X-ray, electron beam, or the like. Thermally decomposable polymers undergo thermal decomposition at temperatures that approach the condensation temperature of the silica source materials and are present during at least a portion of the cross-linking. Such polymers are those which foster templating of the vitrification reaction, control and define pore size, and decompose and diffures out of the matrix at the appropriate time in processing. Examples of these polymers include polymers that have an architecture that provides a three-dimensional structure such as, but not limited to, block copolymers, i.e., diblock, triblock, and multiblock copolymers; star block copolymers; radial diblock copolymers; graft diblock copolymers; cografted copolymers; dendrigraft copolymers; tapered block copolymers; and combinations of these architectures. Further examples of degradable polymers are found in U.S. Pat. No. 6,204,202, which is incorporated herein by reference in its entirety.

The porogen of the present invention could also comprise a surfactant. For silica sol-gel based films in which the porosity is introduced by the addition of surfactant that is subsequently removed, varying the amount of surfactant can vary porosity. Typical surfactants exhibit an amphiphilic nature, meaning that they can be both hydrophilic and hydrophobic at the same time. Amphiphilic surfactants possess a hydrophilic head group, or groups which have a strong affinity for water and a long hydrophobic tail which is organophilic and repels water. The surfactants can be anionic, cationic, nonionic, or amphoteric. Further classifications of surfactants include silicone surfactants, poly(alkylene oxide) surfactants, and fluorochemical surfactants. However, for the formation of dielectric layers for IC applications, non-ionic surfactants are generally preferred. The surfactants used in the present invention may not behave in the traditional sense, i.e., to form micelles or act as surface active agents. Suitable surfactants for use in the mixture include, but are not limited to, octyl and nonyl phenol ethoxylates such as TRITON® X-114, X-102, X-45, X-15; alcohol ethoxylates such as BRIJ® 56 ($C_{16}H_{33}$ ($OCH_2CH_2)_{10}OH$) (ICI), BRIJ® 58 ($C_{16}H_{33}(OCH_2CH_2)_{20}$ OH (ICI), and acetylenics diols such as SURFYNOLS® 465 and 485 (Air Products and Chemicals, Inc.). Further surfactants include polymeric compounds such as the tri-block EO-PO-EO co-polymers PLURONIC® L121, L123, L31, L81, L101 and P123 (BASF, Inc.). Still further exemplary surfactants include alcohol (primary and secondary) ethoxylates, amine ethoxylates, glucosides, glucamides, polyethylene glycols, poly(ethylene glycol-co-propylene glycol), or other surfactants provided in the reference *McCutcheon's Emulsifiers and Detergents*, North American Edition for the Year 2000 published by Manufacturers Confectioners Publishing Co. of Glen Rock, N.J.

The surfactant selected has 90% or less, preferably 60% or less, and more preferably 10% or less weight percent of ethylene oxide ("EO"). It is believed that lower weight percents of EO may produce materials and films that have higher $E_0'$ values.

It is preferred that the surfactants in the mixture have a metal content less than 20 ppm. While commercially available unpurified surfactants could be used, the final films may have impurity levels far in excess of acceptable levels, and thus the surfactant should be purified. Surfactant purification can be performed using common procedures, such as employment of ion exchange columns in which alkali ions can be retained and hydrogen ions released in their place. These unpurified surfactants may commonly possess alkali ion concentrations in the range from about 100 to 1000 parts per million. The goal of surfactant purification is to reduce alkali ion impurity levels to less than 50 parts per billion. Acceptable concentrations of alkali ion impurities within the film material are less than 10 parts per billion for each alkali element.

The porogen may be a hyper branched or dendrimeric polymer. Hyper branched and dendrimeric polymers generally have low solution and melt viscosities, high chemical reactivity due to surface functionality, and enhanced solubility even at higher molecular weights. Some non-limiting examples of suitable decomposable hyper-branched polymers and dendrimers are provided in "Comprehensive Polymer Science", $2^{nd}$ Supplement, Aggarwal, pp. 71-132 (1996) which is incorporated herein by reference in its entirety.

The porogen within the film-forming mixture may also be a polyoxyalkylene compound such as polyoxyalkylene nonionic surfactants, polyoxyalkylene polymers, polyoxyalkylene copolymers, polyoxyalkylene oligomers, or combinations thereof. An example of such is a polyalkylene oxide that includes an alkyl moiety ranging from $C_2$ to $C_6$ such as polyethylene oxide, polypropylene oxide, and copolymers thereof.

In addition to the aforementioned ingredients, the film-forming mixture may also comprise an ionic additive. Ionic additives are added to mixture if the metal impurity content is about 500 ppm or less. Generally, the ionic additive is a compound chosen from a group of cationic additives of the general composition $[NR(CH_3)_3]^+A^-$, where R is a hydrophobic ligand of chain length 1 to 24, including tetramethylammonium and cetyltrimethylammonium, and A– is an anion, which may be chosen from the group consisting essentially of formate, nitrate, oxalate, acetate, phosphate, carbonate, and hydroxide and combinations thereof. Tetramethylammonium salts, or more generally tetraalkylammonium salts, or tetraorganoammonium salts or organoamines in acidic media are added to surfactant templated porous oxide precursor formulations to increase the ionic content, replacing alkali ion impurities (sodium and potassium) removed during porogen purification.

Alternatively, the ionic additive may be an amine additive which forms an ionic ammonium type salt in the acidic precursor mixture. The suitable amine additive is selected from the group consisting of: triethylenediamine (TEDA); diethanolamine (DELA); triethanolamine, (TELA); aminopropyidiethanolamine (APDEA); bis(p-aminocyclohexyl) methane (PACM); quinuclidine (QUIN); 3-Quinuclidinol; trimethylamine (TMA); tetramethylethylendiamine, (TMEDA); tetramethyl-1,3-propanediamine (TMPDA); trimethylamine oxide (TMAO); PC-9, N,N,N-tris(N',N'-dimethyl-3-aminopropyl)amine; PC-77, 3,3'-bis(dimethylamino)-N-methyldipropylamine; CB, choline hydroxide; DMAP, 4-dimethylaminopyridine; DPA, diphenylamine; or TEPA, tetraethylenepentamine.

In embodiments where the film is formed through a spin-on approach, the mixture comprises, inter alia, at least one silica source, a porogen, a catalyst, and water. In certain preferred embodiments, the mixture further comprises a solvent, an ionic additive, and a surfactant. In brief, dispensing the mixture onto a substrate and evaporating the solvent and water can form the films. The surfactant and remaining solvent and water are generally removed by curing the coated substrate to one or more temperatures and for a time sufficient to produce the low dielectric film.

The mixture may be deposited onto the substrate to form the coated substrate. The term substrate, as used herein, is any suitable composition that is formed before the dielectric film of the present invention is applied to and/or formed on that composition. Suitable substrates that may be used in conjunction with the present invention include, but are not limited to, semiconductor materials such as gallium arsenide ("GaAs"), silicon, and compositions containing silicon such as crystalline silicon, polysilicon, amorphous silicon, epitaxial silicon, silicon dioxide ("$SiO_2$"), and mixtures thereof. The mixture may be applied onto the substrate via a variety of methods including, but not limited to, dipping, rolling, brushing, spraying, or spin coating. The coated substrate may then be pre-heated to substantially complete the hydrolysis of the silica source, continue the crosslinking process, and drive off any remaining solvent, if present, from the film. In other embodiments such as CVD based methods, the mixture may be vaporized and/or form particulates that coat the substrate.

The coated substrate is then further heated or cured to form the dielectric film. Specific temperature and time durations will vary depending upon the ingredients within the mixture, the substrate, and the desired pore volume. In certain embodiments, the cure step is conducted at two or more temperatures rather than a controlled ramp or soak. The first temperature, typically below 300° C., may be to remove the water and/or solvent from the mixture and to further cross-linking reactions. The second temperature may be to remove the porogen and to substantially, but not necessarily completely, cross-link the material. In certain preferred embodiments of the present invention, the coated substrate is heated to one or more temperatures ranging from about 250 to about 450° C., or more preferably about 400° C. or below. The heating or cure step is conducted for a time of about 30 minutes or less, preferably about 15 minutes or less, and more preferably about 6 minutes or less.

The cure step may be conducted via thermal methods such as a hot plate, oven, furnace or the like. For thermal methods, the curing of the coated substrate may be conducted under controlled conditions such as atmospheric pressure using nitrogen, inert gas, air, or other N2/O2 mixtures (0-21% $O_2$), vacuum, or reduced pressure having controlled oxygen concentration. Alternatively, the cure step may be conducted by electron-beam, ozone, plasma, X-ray, ultraviolet radiation or other means. In preferred embodiments, the curing step is conducted via a thermal method in an air, nitrogen, or inert gas atmosphere, under vacuum, or under reduced pressure having an oxygen concentration of 10% or lower.

The materials of the present invention may be further subjected to post cure steps such as post cure e-beam, UV, X-ray or other treatments. These treatments may, for example, increase the mechanical integrity of the material or decrease the dielectric constant by reducing the amount of adsorbed water.

By determining the normalized wall elastic modulus of a dielectric material, it may be possible to tune the dielectric constant and elastic modulus of the film of the invention to attain the desired dielectric constant for a given application. This may be accomplished by varying the void fraction in the film. The void fraction can be varied by varying the amount of porogen in the mixture, such as surfactant or solvent.

The films of the invention are mesoporous. The term "mesoporous", as used herein, describes pore sizes that range from about 10 Å to about 500 Å, preferably from about 10 Å to about 100 Å, and most preferably from about 10 Å to about 50 Å. It is preferred that the film have pores of a narrow size range and that the pores are homogeneously distributed throughout the film. Films of the invention preferably have a porosity of about 10% to about 90%, more preferably about 40% to about 85%. The porosity of the films may be closed or open pore.

In certain embodiments of the present invention, the diffraction pattern of the film does not exhibit diffraction peaks at a d-spacing greater than 10 Angstroms. The diffraction pattern of the film may be obtained in a variety of ways such as, but not limited to, neutron, X-ray, small angle, grazing incidence, and reflectivity analytical techniques. For example, conventional x-ray diffraction data may be collected on a sample film using a conventional diffractometer such as a Siemens D5000 θ-θ diffractometer using CuKα radiation. Sample films may also be analyzed by X-ray reflectivity (XRR) data using, for example, a Rigaku ATX-G high-resolution diffraction system with Cu radiation from a rotating anode x-ray tube. Sample films may also be analyzed via small-angle neutron scattering (SANS) using, for example, a system such as the 30 meter NG7 SANS instrument at the NIST Center for Neutron Research.

The dielectric material of the present invention has mechanical properties that allow the material, when formed into a film, to resist cracking and enable it to be chemically/mechanically planarized. Further, the dielectric films of the present invention exhibit low shrinkage. Dielectric films of the present invention generally have a thickness that ranges from 0.05 to about 2 μm. Dielectric films of the present invention may exhibit a modulus of elasticity that ranges from about 0.5 to about 10 GPa, and generally between 2 and 6 GPa; a hardness value that ranges from about 0.2 to about 2.0 GPa, and generally from about 0.4 to about 1.2 GPa, and a refractive index determined at 633 nm of between 1.1 and 1.5.

The film of the present invention provides excellent insulating properties and a relatively high modulus of elasticity. The film also provides advantageous uniformity, dielectric constant stability, cracking resistance, and surface hardness. Suitable applications for the film of the present invention include interlayer insulating films for semiconductor devices such as LSIs, system LSIs, DRAMs, SDRAMs, RDRAMs, and D-RDRAMs, protective films such as surface coat films for semiconductor devices, interlayer insulating films for multilayered printed circuit boards, and protective or insulating films for liquid-crystal display devices. Further applications include capping layers, hard mask, or etch stops.

The invention will be illustrated in more detail with reference to the following examples, but it should be understood that the present invention is not deemed to be limited thereto.

In the following examples, unless stated otherwise, properties were obtained from sample films that were spun onto a low resistance (0.01 Ωcm) single crystal silicon wafer substrate and calcined to 400° C. The thickness, film refractive index, and porosity values of each film were determined by spectroscopic ellipsometry using a variable angle spectroscopic ellipsometer, Model SE 800 manufactured by Sentech Instruments GmbH, and calculated by SpectraRay software. The refractive index, film thickness, and percentage of air values were obtained by simulating the measurement using various models such as Bruggemann in the wavelength range from 400 to 800 nm with mean square error of about 1 or less. For the thickness values, the error between the simulated thickness and actual film thickness values measured by profilometry was generally less than 2%.

The dielectric constant of each sample film was determined according to ASTM Standard D150-98. The capacitance-voltage of each film were obtained at 1 MHz with a Solartron Model SI 1260 Frequency Analyzer and MSI Electronics Model Hg 401 single contact mercury probe. The error in capacitance measurements and mercury electrode area (A) was less than 1%. The substrate (wafer) capacitance ($C_{si}$), background capacitance ($C_b$) and total capacitance ($C_T$) were measured between +20 and −20 volts and the thin film sample capacitance ($C_s$) was calculated by Equation (6):

$$C_s = C_{Si}(C_T-C_b)/[C_{Si}-(C_T-C_b)] \qquad \text{Equation (6)}$$

The dielectric constant of each film was calculated by Equation (7) wherein d is the film thickness, A is the mercury electrode area, and $\epsilon_0$ is the dielectric constant in vacuum:

$$\varepsilon = \frac{C_S d}{\varepsilon_0 A} \qquad \text{Equation (7)}$$

The total error of the dielectric constant of the film was expected to be less than 6%.

The elastic modulus for each film was taken from 1 cm³ samples cleaved from the center of the wafer and mounted onto an aluminum stub using a low-melting-temperature adhesive, CRYSTALBOND® which is manufactured by Armco Products Inc., of Valley Cottage, N.Y. Indentation tests were performed on a NANOINDENTER® Dynamic Contact Module (DCM) manufactured by MTS Systems Corporation with an ACCUTIP® Berkovich diamond tip using the continuous stiffness measurement ("CSM") method described in the reference, Oliver et al., "An improved technique for Determining Hardness and Elastic Modulus Using Load and Displacement Sensing Indentation Experiments", J. Material Research, 1992, 7 [6], pp. 1564-1583, incorporated herein by reference in its entirety. A small oscillation was superimposed on the primary loading signal and the resultant system response was analyzed by means of a frequency-specific amplifier. The excitation frequency was held constant throughout the test at 75 Hz (DCM) and the excitation amplitude was controlled such that the resulting displacement amplitude remained constant at 1 nm (DCM).

Each indentation experiment allowed for a continuous measure of the contact stiffness, S. Using the dynamic measure of S, and established formulae for Young's modulus and hardness (Poisson's Ratio=0.18 for silica, 0.25 for low κ films), every individual indentation experiment yielded Young's modulus and hardness as a continuous function of surface penetration. An array of 5 to 10 indents was performed on each sample and a distance of approximately 20-25 microns separated successive indents. The results from each indentation experiment were examined and any "outliers" were excluded. The results for Young's modulus and hardness vs. penetration for the indentation experiments of each sample were averaged using discrete displacement windows of approximately 5 nm. Using the data in this window, an average, standard deviation, and confidence interval for each sample were then calculated. The same statistics were likewise calculated for the rest of the discrete windows. Hardness results were obtained and averaged in the same manner. Hardness and Young's modulus were reported as the measured value of hardness at the minimum of the hardness curve (at about 30-50 nm) and the measured value of modulus at the minimum of the modulus curve (at about 30-50 nm). The errors of the modulus and the hardness of the film are expected to be less than 10 percent.

EXAMPLES

The following table, Table I, provides a list of acronyms that are used in the examples and throughout the application.

TABLE I

CHEMICAL ABBREVIATIONS

| Acronym | Generic Name |
| --- | --- |
| Silica sources | |
| TAS | Tetraacetoxysilane |
| TEOS | Tetraethoxysilane |
| TMOS | Tetramethoxysilane |
| TBOS | Tetra-n-butoxysilane |
| MTES | Methyltriethoxysilane |
| DMDES | Dimethyldiethoxysilane |
| PTES | Phenyltriethoxysilane |
| FTES | Fluorotriethoxysilane |
| HDTMS | Hexadecyltrimethoxysilane |
| MTAS | Methytriacetoxysilane |
| HMDS | Hexamethyldisilazane |
| TEDMDS | Tetraethoxydimethyldisiloxane |
| TMDEDS | Tetramethyldiethoxydisiloxane |
| poly-TEOS | Polydiethoxysiloxane |
| TMCTS | Tetramethylcyclotetrasilane |
| OctaTMA-POSS | Silsesquioxane cube w/8 TMA + |
| TSE-POSS | trisilanolethyl-POSS |
| Solvents | |
| PGMEA | propylene glycol methyl ether acetate |
| PGPE | propylene glycol propyl ether |
| Bases | |
| TMAH | Tetramethylammonium hydroxide |
| Surfactants | |
| X114 | Triton X-114 (octyphenol ethoxylate) |
| Surf 485 | Surfynol 485 (acetylenic diol ethoxylate) |

TABLE I-continued

CHEMICAL ABBREVIATIONS

| Acronym | Generic Name |
| --- | --- |
| L121 | Pluronic L121 (EO-PO-EO tri-block co-polymer) |
| L101 | Pluronic L101 (EO-PO-EO tri-block co-polymer) |
| L81 | Pluronic L81 (EO-PO-EO tri-block co-polymer) |
| L31 | Pluronic L31 (EO-PO-EO tri-block co-polymer) |

General Process for Preparing Array Elements

A mixture was prepared containing a hydrophilic silica source and one or more hydrophobic silica sources. To the silicates, a quantity of a 4:1 volume ratio of solvent to surfactant and additional solvent was added. After the organic components were added to one another, the catalysts and water were added to the mixture in the following order: water, acid catalyst, and ionic additives. Following the addition of water, the mixture was aged at room temperature for 5 to 10 minutes after which the aging step was repeated after the addition of the acid catalyst and ionic additive. After all the reagents were added, the mixture was agitated for less than about 5 minutes and aged at room temperature for a period ranging from 1-24 hours, depending upon the reagents within the mixture.

Figure 3:
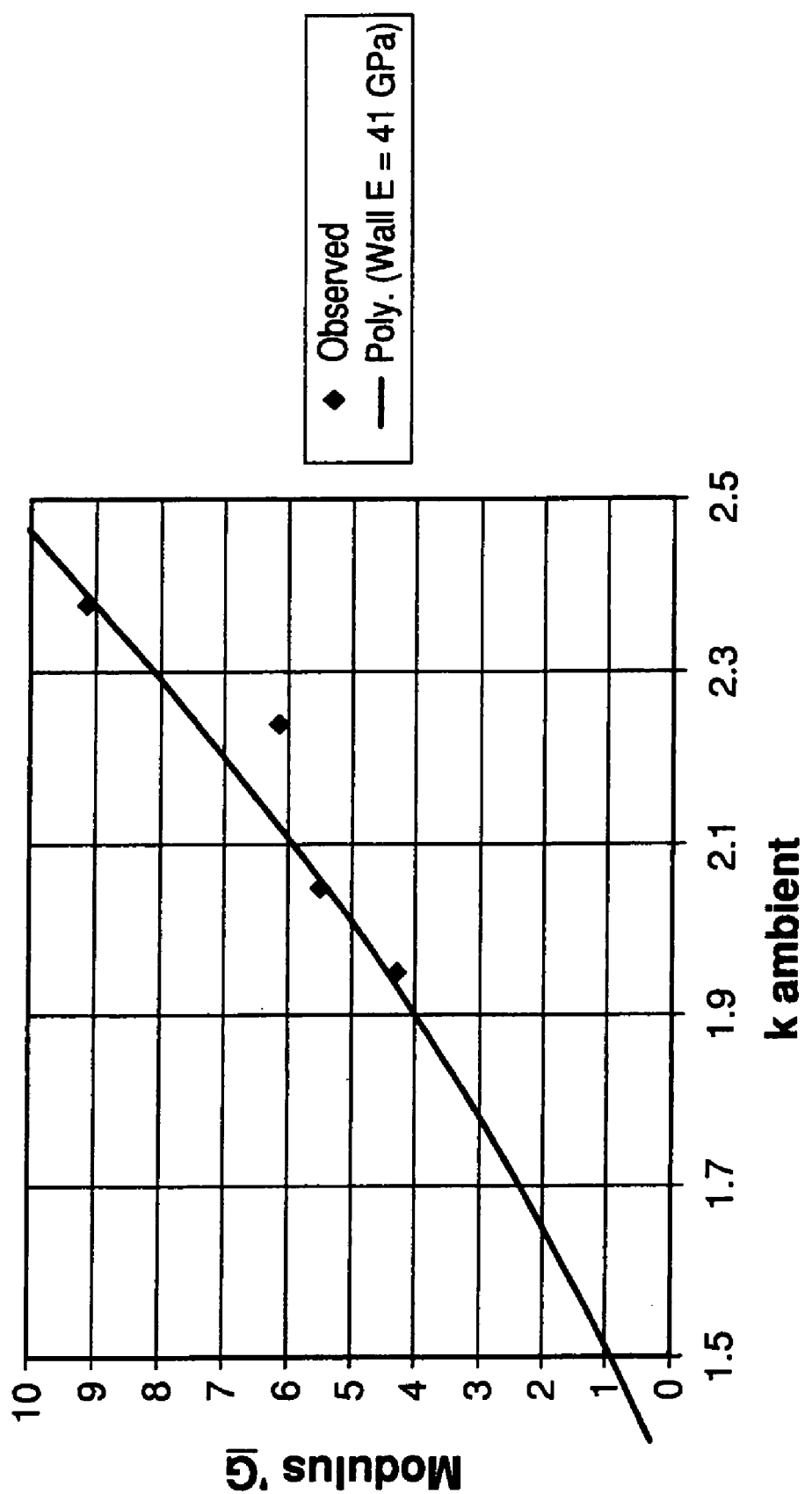
FIG. 3 provides a comparison of the theoretical modulus vs. κ curve for a wall κ of 4.2 and a wall elastic modulus of 41 GPa to the data points from the literature that illustrates the effect of varying the amount of solvent on the material.

A silicon wafer having a diameter of about 125 mm was placed in the holder of an orbital movement device described in FIG. 3 of pending U.S. patent application Ser. No. 10/158,375 entitled "Apparatus and Methods for Forming Films on Substrates". The orbital movement device was operated to move the wafer at a speed of about 2200 rpm along an orbital path having a major axis of about 4.5 mm and a minor axis of about 2.25 mm.

While the wafer was moving along its orbital path, the deposition device was operated to serially dispense subsequent samples of liquid on the wafer in a generally square pattern (e.g., a matrix of five rows of five samples each), with the center-to-center spacing between adjacent samples being about 17.5 mm. The volume of each liquid sample was in the range of about 2-5 microliters. Dispensing of the liquid samples on the wafer occurred over a period of about 12 minutes, and the substrate was moved on its orbital path for a total duration of about 15 minutes (e.g., about 3 minutes longer than the time at which the last liquid sample is deposited on the substrate), after which orbital movement of the substrate was stopped. Orbital movement of the wafer subjected the liquid samples to a non-contact spreading force to facilitate spreading of the liquid samples on the wafer surface to form films thereon. The array of films were heated on a hot plate at 90° C. for 90 seconds, 180° C. for 90 seconds, and 400° C. for 180 seconds in an air or nitrogen atmosphere, thereby forming optically transparent thin films. The films produced through this process could then characterized directly to determine the refractive index, dielectric constant, modulus, hardness, and normalized wall elastic modulus.

Example 1-14

Selected Array Elements as Compartive Examples to Spun Coated Films

Sample films were prepared in the same manner as the general process for preparing array elements. The volume of each reagent dispensed into individual microtiter wells is provided in Table II. The solutions were dispensed, agitated, and calcined as in the general procedure to prepare array elements to films. The properties of each film are provided in Table III.

TABLE II

COMPOSITION OF ARRAY ELEMENTS

| Ex. | Hydrophilic Source (μl) | Hydrophobic Source (μl) | 4:1 Volume Solvent: Surfactant Ratio (μl) | Solvent (μl) | Water (μl) | Nitric Acid (μl) | TMAH (μl) |
|---|---|---|---|---|---|---|---|
| 1 | 138.2 TEOS | 144.4 MTES | 329.9 PGMEA: L101 | 573.2 PGMEA | 0.0 | 247.2 0.1 M | 5 2.4 wt. % |
| 2 | 121.0 TEOS | 126.2 MTES | 177.2 pentanol:X114; 204.7 PGMEA:X114 | 207.5 pentanol; 261.8 PGMEA | 0.0 | 119.9 0.1 M | 5 2.4 wt. % |
| 3 | 68.5 TEOS | 71.5 MTES | 163.4 PGPE: L101 | 274.8 PGPE | 93.7 | 26.3 0.025 M | 5 1.2 wt. % |
| 4 | 68.5 TEOS | 71.5 MTES | 163.4 PGPE: L101 | 274.8 PGPE | 58.7 | 61.2 0.2 M | 5 1.2 wt. % |
| 5 | 49.6 TEOS | 61.0 MTES; 9.7 DMDES | 189.3 PGPE: X114 | 270.6 PGPE | 26.8 | 29.7 0.2 M | 5 1.2 wt. % |
| 6 | 74.3 TEOS | 67.9 MTES; 18.8 HMDS | 163.5 PGPE: L101 | 258.0 PGPE | 58.7 | 61.3 0.2 M | 5 1.2 wt. % |
| 7 | 57.2 TEOS | 39.3 MTAS | 139.6 PGPE: X45 | 147.2 PGPE | 49.4 | 26.3 0.025 M | 5 1.2 wt. % |
| 8 | 54.0 TEOS | 84.2 MTAS | 163.7 PGPE: X45 | 276.3 PGPE | 78.4 | 26.4 0.025 M | 5 1.2 wt. % |
| 9 | 57.2 TEOS | 39.3 MTAS | 139.6 PGPE: X45 | 259.6 PGPE | 49.4 | 26.3 0.025 M | 5 1.2 wt. % |
| 10 | 69.9 TEOS | 71.7 MTAS | 139.7 PGPE: X45 | 445.6 PGPE | 85.7 | 26.3 0.025 M | 5 1.2 wt. % |
| 11 | 54.0 TEOS | 84.2 MTAS | 139.5 PGPE: X45 | 276.3 PGPE | 81.6 | 26.2 0.025 M | 5 1.2 wt. % |
| 12 | 69.8 TEOS | 71.7 MTAS | 139.6 PGPE: X45 | 445.3 PGPE | 42.4 | 26.3 0.025 M | 5 1.2 wt. % |
| 13 | 69.8 TEOS | 71.6 MTAS | 139.5 PGPE: X45 | 276.4 PGPE | 42.4 | 26.2 0.025 M | 5 1.2 wt. % |
| 14 | 85.8 TEOS | 59.0 MTAS | 139.7 PGPE: X45 | 445.4 PGPE | 89.7 | 26.3 0.025 M | 5 1.2 wt. % |

TABLE III

PROPERTIES

| Example | Refractive Index | Thickness (Å) | Dielectric Constant | Elastic Modulus (GPa) | Normalized Wall Elastic Modulus (GPa) |
|---|---|---|---|---|---|
| 1 | 1.2051 | 9595 | 2.15 | 2.55 | 16 |
| 2 | 1.1587 | 12013 | 1.98 | 2.59 | 23 |
| 3 | 1.1828 | 10434 | 2.10 | 3.21 | 22 |
| 4 | 1.1963 | 10525 | 2.24 | 2.84 | 16 |
| 5 | 1.1839 | 7595 | 2.02 | 2.74 | 22 |
| 6 | 1.1958 | 9700 | 2.13 | 2.49 | 16 |
| 7 | 1.1955 | 9906 | 1.67 | 2.56 | 52 |
| 8 | 1.2347 | 6800 | 1.87 | 2.70 | 30 |
| 9 | 1.1985 | 6498 | 2.04 | 2.92 | 23 |
| 10 | 1.2276 | 5887 | 2.08 | 3.70 | 27 |
| 11 | 1.2322 | 6995 | 2.10 | 2.81 | 19 |
| 12 | 1.2293 | 4434 | 2.11 | 3.63 | 25 |
| 13 | 1.2287 | 6362 | 2.13 | 3.16 | 21 |
| 14 | 1.2259 | 6034 | 2.23 | 4.36 | 25 |

Example 15

Spin Coating

A mixture was prepared containing 317.9 μl of TEOS and 326.3 μl of MTAS. A quantity of 635.7 μl of a 4:1 volume ratio of PGPE: Triton X-45 and 2027.3 μl of PGMEA was added to the mixture. Next, additional reagents were added to the mixture in the following order: 390 μl of water, 119.6 μl of 0.025 M $HNO_3$, and 22.8 μl of 1.2 wt. % TMAH in water. After the addition of water the mixture was aged at room temperature for 5 minutes. The subsequent addition of $HNO_3$ and TMAH were also followed by individual 5 minutes aging steps. Once all of the reagents have been added, the entire solution is aged for 5 minutes at room temperature and agitated for 2-3 minutes to throughly mix the solution. The resulting clear solution was then aged for 1-24 hours at room temperature prior to spin coating.

The sol was dispensed onto a low resistivity P type <100> Si wafer spinning at 500 rpm for 7 seconds and then accelerated to 1800 rpm for 35-40 seconds. The film formed during the spin coating process was then calcined on a hot plate at 90° C. for 90 seconds, 180° C. for 90 seconds, and 400° C. for 180 seconds in an air or nitrogen atmosphere to remove the porogen. The properties of each film are provided in Table V.

TABLE IV

COMPOSITION OF SPIN COATED FILMS

| Ex. | Hydrophilic Source (μl) | Hydrophobic Source (μl) | 4:1 Volume Solvent:Surfactant Ratio (μl) | Solvent (μl) | Water (μl) | Nitric Acid (μl) | TMAH (μl) |
|---|---|---|---|---|---|---|---|
| 15 | 317.9 TEOS | 326.3 MTAS | 536.7 PGPE:X45 | 2027.7 PGPE | 390 | 119.6 0.025 M | 22.8 1.2 wt % |
| 16 | 335.1 TEOS | 344.0 MTAS | 670.1 PGPE:X45 | 2137.5 PGPE | 203.3 | 126.0 0.025 M | 24.0 1.2 wt % |
| 17 | 387.3 TEOS | 266.2 MTAS | 630.2 PGPE:X45 | 2010.2 PGPE | 405 | 118.5 0.025 M | 22.6 1.2 wt % |
| 18 | 381.1 TEOS | 262.9 MTAS | 930.0 PGPE:X45 | 1729. PGPE | 329.1 | 174.9 0.025 M | 33.3 1.2 wt % |
| 19 | 173.0 TEOS | 180.8 MTES | 413.0 PGMEA:L101 | 717.5 PGMEA | | 309.5 0.1 M | 6.3 2.4 wt % |
| 20 | 178.0 TEOS | 185.7 MTES | 260.7 pentanol:X114; 301.3 PGMEA:X114 | 305.2 pentanol; 385.3 PGMEA | | 176.4 0.1 M | 7.4 2.4 wt % |
| 21 | 172.9 TEOS | 180.6 MTES | 412.7 PGPE:L101 | 694.0 PGPE | 236.5 | 66.3 0.025 M | 12.6 1.2 wt % |
| 22 | 172.9 TEOS | 180.6 MTES | 412.7 PGPE:L101 | 694.0 PGPE | 148.2 | 154.6 0.2 M | 12.6 1.2 wt % |
| 23 | 149.5 TEOS | 183.9 MTES; 29.1 DMDES | 570.9 PGPE:X114 | 815.1 PGPE | 80.9 | 89.6 0.2 M | 15.1 1.2 wt % |
| 24 | 195.7 TEOS | 174.8 MTES; 49.5 HMDS | 430.7 PGPE:L101 | 679.7 PGPE | 154.7 | 161.3 0.2 M | 13.2 1.2 wt % |
| 25 | 1.43 ml TEOS | 1.50 ml MTES | 3.43 ml PGPE:L101 | 5.76 ml PGPE | 1.96 ml | 0.55 ml 0.025 M | 0.10 ml 1.2 wt % |
| 26 | 1.43 ml TEOS | 1.50 ml MTES | 3.43 ml PGPE:L101 | 5.76 ml PGPE | 1.23 ml | 1.28 ml 0.2 M | 0.10 ml 1.2 wt % |
| 27 | 1.44 ml TEOS | 1.50 ml MTES | 3.43 ml PGMEA:L101 | 5.96 ml PGMEA | | 2.57 ml 0.1 M | 0.05 ml 2.4 wt % |

TABLE V

PROPERTIES

| Example | Refractive Index | Thickness (Å) | Dielectric Constant | Elastic Modulus (GPa) | Normalized Wall Elastic Modulus (GPa) |
|---|---|---|---|---|---|
| 15 | 1.2331 | 4496 | 2.15 | 3.69 | 23 |
| 16 | 1.2195 | 3285 | 1.96 | 2.61 | 24 |
| 17 | 1.2279 | 4657 | 2.28 | 4.27 | 22 |
| 18 | 1.1981 | 5292 | 2.15 | 2.97 | 19 |
| 19 | 1.1969 | 4615 | 1.96 | 2.83 | 26 |
| 20 | 1.1828 | 4718 | 1.94 | 2.42 | 23 |
| 21 | 1.1276 | 5820 | 2.07 | 3.00 | 22 |
| 22 | 1.2088 | 5000 | 2.08 | 3.09 | 22 |
| 23 | 1.2164 | 4383 | 2.03 | 2.46 | 19 |
| 24 | 1.1984 | 6270 | 1.91 | 2.58 | 26 |
| 25 | 1.2008 | 4825 | 2.03 | 2.31 | 18 |
| 26 | 1.2107 | 4524 | 2.09 | 2.29 | 16 |
| 27 | 1.2116 | 3410 | 2.05 | 2.29 | 17 |

Examples 16-27

Sample films were prepared in the same manner as Example 15 except that the types and/or amounts of silane sources, surfactant, solvent, and catalyst in the mixture were varied. These variations are provided in Table IV. The properties of each film are provided in Table V.

As Table V illustrates, under some conditions, materials with high $E_o'$ were obtained at pHs greater than about 4 or using Si sources that generate acetic acid during hydrolysis and condensation.

Comparison of Tables III and V illustrate that compositions having relatively higher normalized wall elastic modulus, produced in an array format using alternative evaporative techniques, such as an orbital movement device, can be reproduced using conventional spin coating techniques.

Array Elements 28-131

Sample films were prepared in the same manner as Example 1 except that the types and/or amounts of silica sources, surfactant, solvent, and catalyst in the mixture were varied. These variations are provided in Table VI. All of the films obtained were transparent. The properties of each film are provided in Table VII.

As Table VII illustrates, array examples 28 through 34 have a dielectric contant that ranges from 2.4 to 2.7 and a normalized wall elastic modulus that ranges from 15 to 17. Examples 35 through 47 have a dielectric contant that ranges from 2.1 to 2.4 and a normalized wall elastic modulus that ranges from 15 to 17 GPa. Examples 48 through 56 have a dielectric contant that ranges from 1.9 to 2.1 and a normalized wall elastic modulus that ranges from 15 to 17 GPa. Examples 57 through 67 have a dielectric contant that ranges from 1.7 to about 1.9 and a normalized wall elastic modulus that ranges from 15 to about 17 GPa. Examples 68 and 69 have a dielectric contant below about 1.7 and a normalized wall elastic modulus that ranges from 15 to 17 GPa.

Examples 70 and 71 have a dielectric contant that ranges from 2.4 to 2.7 and a normalized wall elastic modulus that ranges from 17 to 20 GPa. Examples 72 through 78 have a dielectric contant that ranges from 2.1 to 2.4 and a normalized wall elastic modulus that ranges from 17 to 20 GPa. Examples 79 through 85 have a dielectric contant that ranges from 1.9 to 2.1 and a normalized wall elastic modulus that ranges from 17 to 20 GPa. Examples 86 through 90 have a dielectric contant that ranges from 1.7 to 1.9 and a normalized wall elastic modulus that ranges from 17 to 20 GPa.

Examples 91 through 93 have a dielectric contant below about 1.7 and a normalized wall elastic modulus that ranges from 17 to 20 GPa.

Examples 94 through 97 have a dielectric contant that ranges from 2.1 to 2.4 and a normalized wall elastic modulus that is greater than 20 GPa. Examples 98 through 103 have a dielectric contant that ranges from 1.9 to 2.1 and a normalized wall elastic modulus that is greater than 20 GPa. Examples 104 through 107 have a dielectric contant that ranges from 1.7 to 1.9 and a normalized wall elastic modulus that is greater than 20 GPa. Examples 108 through 111 have a dielectric contant below about 1.7 and a normalized wall elastic modulus that is greater than 20 GPa.

Examples 112 through 115 have a dielectric contant that ranges from 1.8 to 1.95 and a normalized wall elastic modulus that is greater than 26 GPa. Examples 116 through 121 have a dielectric contant below about 1.8 and a normalized wall elastic modulus that is greater than 20 GPa.

Examples 122 through 131 have a dielectric contant below about 2.0 and a normalized wall elastic modulus that ranges from 10 to 15 Gpa.

| Example # | MF HNO3 | MF TMAH | MF Surfactant | MF Total Silicon Source | MF TEOS | Total MF Hydrophobic Silicon Source | MF Hydrophobic Source 1 | MF Hydrophobic Source 2 | MF Total Solvent | MF Water | MF PGPE |
|---|---|---|---|---|---|---|---|---|---|---|---|
| 28 | 0.00075 | 0.00008 | 0.00135 (L81) | 0.07760 | 0.05433 | 0.02327 | 0.02327 (MTES) | 0.00000 | 0.92022 | 0.48851 | 0.43171 |
| 29 | 0.00007 | 0.00007 | 0.00986 (Triton X-35) | 0.08525 | 0.06718 | 0.01807 | 0.01807 (DMDES) | 0.00000 | 0.90474 | 0.58036 | 0.32438 |
| 30 | 0.00078 | 0.00009 | 0.00925 (Triton X-45) | 0.10112 | 0.05055 (poly TEOS) | 0.05055 | 0.05055 (MTES) | 0.00000 | 0.88877 | 0.43019 | 0.45858 |
| 31 | 0.00120 | 0.00006 | 0.00178 (Surf 485) | 0.06465 | 0.03557 | 0.02909 | 0.02909 (MTAS) | 0.00000 | 0.93230 | 0.38888 | 0.54342 (1-pentanol) |
| 32 | 0.00083 | 0.00009 | 0.00261 (Surf 485) | 0.06003 | 0.03001 (C1 bridge) | 0.03001 | 0.03001 (MTAS) | 0.00000 | 0.93644 | 0.30632 | 0.63012 (1-pentanol) |
| 33 | 0.00081 | 0.00006 | 0.00098 (L81) | 0.06789 | 0.03663 | 0.03125 | 0.03125 (MTES) | 0.00000 | 0.93026 | 0.66688 | 0.26338 |
| 34 | 0.00007 | 0.00006 | 0.00757 (Triton X-35) | 0.05991 | 0.03296 | 0.02695 | 0.02695 (MTAS) | 0.00000 | 0.93239 | 0.57500 | 0.35739 |
| 35 | 0.00008 | 0.00008 | 0.00813 (Triton X-45) | 0.06488 | 0.03570 | 0.02919 | 0.02919 (MTAS) | 0.00000 | 0.92683 | 0.50517 | 0.42166 |
| 36 | 0.00006 | 0.00005 | 0.00148 (Surf 485) | 0.05324 | 0.02397 | 0.02927 | 0.02927 (MTAS) | 0.00000 | 0.94517 | 0.49515 | 0.45002 (1-pentanol) |
| 37 | 0.00177 | 0.00008 | 0.00092 (L101) | 0.07017 | 0.03229 | 0.03788 | 0.03788 (MTES) | 0.00000 | 0.92706 | 0.60773 | 0.31933 |
| 38 | 0.00009 | 0.00009 | 0.00994 (Triton X-114) | 0.08068 | 0.04841 | 0.03227 | 0.00807 (FTES) | 0.02420 (MTES) | 0.90920 | 0.47215 | 0.43705 |
| 39 | 0.00072 | 0.00009 | 0.01272 (Triton X-35) | 0.07511 | 0.05331 | 0.02179 | 0.02179 (DMDES) | 0.00000 | 0.91136 | 0.51115 | 0.40021 |
| 40 | 0.00009 | 0.00009 | 0.01002 (Triton X-114) | 0.07323 | 0.05866 | 0.01457 | 0.01322 (MTES) | 0.00135 (TSE-POSS) | 0.91657 | 0.47595 | 0.44062 |
| 41 | 0.00006 | 0.00006 | 0.00083 (L101) | 0.06270 | 0.04758 | 0.01513 | 0.01293 (MTES) | 0.00219 (PTES) | 0.93635 | 0.65039 | 0.28596 |
| 42[1] | 0.00110 | 0.00006 | 0.00079 (L101) | 0.05976 | 0.02756 | 0.03220 | 0.03220 (MTES) | 0.00000 | 0.87582 | 0.62186 | 0.25396 |
| 43 | 0.00115 | 0.00006 | 0.00082 (L101) | 0.06255 | 0.02882 | 0.03372 | 0.03372 (MTES) | 0.00000 | 0.93542 | 0.65016 | 0.28525 (2-ethoxyethylacetate) |
| 44 | 0.00078 | 0.00009 | 0.00144 (L81) | 0.10191 | 0.05096 (poly TEOS) | 0.05096 | 0.05096 (MTES) | 0.00000 | 0.89577 | 0.43357 | 0.46220 |
| 45 | 0.00012 | 0.00010 | 0.01086 (Triton X-114) | 0.06833 | 0.05290 | 0.01543 | 0.00882 (MTES) | 0.00661 (TMCTS) | 0.92059 | 0.51320 | 0.40739 |
| 46 | 0.00089 | 0.00010 | 0.00507 (L31, Triton X-35) | 0.08736 | 0.04029 | 0.04707 | 0.04707 (MTES) | 0.00000 | 0.90657 | 0.51281 | 0.39376 |
| 47 | 0.00008 | 0.00008 | 0.00812 (Triton X-45) | 0.05368 | 0.02416 | 0.02952 | 0.02952 (MTAS) | 0.00000 | 0.93805 | 0.59121 | 0.34684 |
| 48[2] | 0.00115 | 0.00006 | 0.00082 (L101) | 0.06240 | 0.02878 | 0.03362 | 0.03362 (MTES) | 0.00000 | 0.93394 | 0.64935 | 0.28458 |

-continued

| Example # | MF HNO3 | MF TMAH | MF Surfactant | MF Total Silicon Source | MF TEOS | Total MF Hydrophobic Silicon Source | MF Hydrophobic Source 1 | MF Hydrophobic Source 2 | MF Total Solvent | MF Water | MF PGPE |
|---|---|---|---|---|---|---|---|---|---|---|---|
| 49 | 0.00011 | 0.00000 | 0.00305 (Surf 485) | 0.04629 | 0.01341 (C1 bridge) | 0.03288 | 0.03288 (MTAS) | 0.00000 | 0.95055 | 0.48260 | 0.46795 (1-pentanol) |
| 50 | 0.00010 | 0.00010 | 0.01079 (Triton X-114) | 0.07445 | 0.04379 | 0.03066 | 0.02628 (MTES) | 0.00438 (TMCTS) | 0.91457 | 0.50984 | 0.40473 |
| 51 | 0.00017 | 0.00017 | 0.01793 (Triton X-45) | 0.08886 | 0.04000 | 0.04886 | 0.04886 (MTAS) | 0.00000 | 0.89288 | 0.52136 | 0.37152 |
| 52 | 0.00009 | 0.00009 | 0.00994 (Triton X-114) | 0.08068 | 0.04034 | 0.04034 | 0.00807 (FTES) | 0.03227 (MTES) | 0.90920 | 0.47215 | 0.43705 |
| 53 | 0.00009 | 0.00009 | 0.01007 (Triton X-114) | 0.06828 | 0.03281 | 0.03547 | 0.03322 (MTES) | 0.00225 (TSE-POSS) | 0.92147 | 0.47849 | 0.44298 |
| 54 | 0.00005 | 0.00005 | 0.00080 (L81) | 0.05734 | 0.04070 | 0.01664 | 0.01664 (DMDES) | 0.00000 | 0.94176 | 0.62013 | 0.32163 |
| 55 | 0.00069 | 0.00011 | 0.00187 (L81) | 0.08163 | 0.05306 (poly TEOS) | 0.02858 | 0.02858 (MTES) | 0.00000 | 0.91570 | 0.51851 | 0.39719 |
| 56 | 0.00043 | 0.00009 | 0.00988 (Triton X-114) | 0.08027 | 0.03444 | 0.04582 | 0.04582 (MTES) | 0.00000 | 0.90933 | 0.46877 | 0.44056 |
| 57 | 0.00017 | 0.00017 | 0.01826 (Triton X-45) | 0.09002 | 0.03152 | 0.05850 | 0.05850 (MTES) | 0.00000 | 0.89138 | 0.51288 | 0.37850 |
| 58 | 0.00065 | 0.00008 | 0.00138 (L81) | 0.07559 | 0.02646 (poly TEOS) | 0.04913 | 0.04913 (MTES) | 0.00000 | 0.92230 | 0.54157 | 0.38072 |
| 59 | 0.00030 | 0.00000 | 0.00988 (Triton X-114) | 0.08028 | 0.03445 | 0.04583 | 0.04583 (MTES) | 0.00000 | 0.90945 | 0.46883 | 0.44061 |
| 60 | 0.00011 | 0.00009 | 0.00988 (Triton X-114) | 0.08029 | 0.03445 | 0.04584 | 0.04584 (MTES) | 0.00000 | 0.90962 | 0.46892 | 0.44070 |
| 61 | 0.00009 | 0.00009 | 0.01012 (Triton X-114) | 0.06327 | 0.02672 | 0.03656 | 0.03340 (MTES) | 0.00316 (TSE-POSS) | 0.92642 | 0.48106 | 0.44536 |
| 62 | 0.00010 | 0.00010 | 0.00292 (Surf 485) | 0.07737 | 0.04256 | 0.03481 | 0.03481 (MTES) | 0.00000 | 0.91950 | 0.46736 | 0.45214 |
| 63 | 0.00068 | 0.00011 | 0.00645 (Triton X-102) | 0.05808 | 0.02033 | 0.03775 | 0.03775 (MTAS) | 0.00000 | 0.93468 | 0.58430 | 0.35037 |
| 64 | 0.00017 (TFA) | 0.00015 | 0.01664 (Triton X-114) | 0.10847 | 0.04340 | 0.06507 | 0.06507 (MTES) | 0.00000 | 0.87456 | 0.54556 | 0.32900 |
| 65 | 0.00010 | 0.00009 | 0.00994 (Triton X-114) | 0.08070 | 0.04091 | 0.03978 | 0.03978 (DMDES) | 0.00000 | 0.90918 | 0.47211 | 0.43707 |
| 66[3] | 0.00007 | 0.00007 | 0.00093 (L101) | 0.07053 | 0.03253 | 0.03801 | 0.03801 (MTES) | 0.00000 | 0.92578 | 0.57772 | 0.34806 |
| 67 | 0.00014 | 0.00014 | 0.00235 (L81) | 0.07591 | 0.04935 | 0.02656 | 0.02656 (MTAS) | 0.00000 | 0.92146 | 0.47118 | 0.45029 |
| 68 | 0.00006 | 0.00006 | 0.00081 (L101) | 0.06127 | 0.03527 | 0.02600 | 0.02106 (MTES) | 0.00494 (PTES) | 0.93781 | 0.63588 | 0.30193 |
| 69 | 0.00001 | 0.00001 | 0.00171 (L81) | 0.08151 | 0.03750 | 0.04402 | 0.04402 (MTES) | 0.00000 | 0.91676 | 0.47947 | 0.43729 |
| 70 | 0.00078 | 0.00009 | 0.01161 (Triton X-35) | 0.07633 | 0.03818 | 0.03815 | 0.03815 (MTAS) | 0.00000 | 0.91120 | 0.45459 | 0.45660 |
| 71 | 0.00163 | 0.00009 | 0.00864 (Triton X-114) | 0.05931 | 0.04147 | 0.01784 | 0.01368 (MTES) | 0.00416 (TSE-POSS) | 0.93033 | 0.49271 | 0.43762 |
| 72 | 0.00005 | 0.00005 | 0.00571 (Triton X-45) | 0.05692 | 0.03131 | 0.02561 | 0.02561 (MTAS) | 0.00000 | 0.93726 | 0.54627 | 0.39099 |

-continued

| Example # | MF HNO3 | MF TMAH | MF Surfactant | MF Total Silicon Source | MF TEOS | Total MF Hydrophobic Silicon Source | MF Hydrophobic Source 1 | MF Hydrophobic Source 2 | MF Total Solvent | MF Water | MF PGPE |
|---|---|---|---|---|---|---|---|---|---|---|---|
| 73 | 0.00109 | 0.00008 | 0.00227 (Surf 485) | 0.05435 | 0.02447 | 0.02989 | 0.02989 (MTAS) | 0.00000 | 0.94221 | 0.50472 | 0.43750 (1-pentanol) |
| 74 | 0.00005 | 0.00005 | 0.00088 (L81) | 0.05940 | 0.03804 | 0.02136 | 0.02136 (MTES) | 0.00000 | 0.93962 | 0.60247 | 0.33714 |
| 75 | 0.00009 | 0.00009 | 0.00994 (Triton X-114) | 0.08068 | 0.04034 | 0.04034 | 0.00807 (FTES) | 0.03227 (MTES) | 0.90920 | 0.47215 | 0.43705 |
| 76 | 0.00008 | 0.00006 | 0.00082 (L101) | 0.06257 | 0.02883 | 0.03374 | 0.03374 (MTES) | 0.00000 | 0.93647 | 0.65112 | 0.28535 |
| 77 | 0.00007 | 0.00007 | 0.00959 (Triton X-35) | 0.05827 | 0.03618 | 0.02210 | 0.02210 (DMDES) | 0.00000 | 0.93199 | 0.63015 | 0.30184 |
| 78 | 0.00007 | 0.00007 | 0.00729 (Triton X-45) | 0.05817 | 0.03201 | 0.02617 | 0.02617 (MTAS) | 0.00000 | 0.93440 | 0.55633 | 0.37807 |
| 79 | 0.00067 | 0.00008 | 0.00100 (L101) | 0.08802 | 0.03962 | 0.04840 | 0.04840 (MTAS) | 0.00000 | 0.91024 | 0.51447 | 0.39576 |
| 80 | 0.00011 | 0.00011 | 0.01143 (Triton X-45) | 0.07601 | 0.04181 | 0.03419 | 0.03419 (MTAS) | 0.00000 | 0.91235 | 0.45899 | 0.45336 |
| 81[4] | 0.00007 | 0.00007 | 0.00093 (L101) | 0.07022 | 0.03238 | 0.03784 | 0.03784 (MTES) | 0.00000 | 0.92230 | 0.57513 | 0.34717 |
| 82 | 0.00082 | 0.00009 | 0.00990 (Triton X-114) | 0.08039 | 0.03708 | 0.04331 | 0.04331 (MTES) | 0.00000 | 0.90880 | 0.47329 | 0.43551 (1-pentanol/PGPE) |
| 83 | 0.00082 | 0.00009 | 0.00990 (Triton X-114) | 0.08039 | 0.03708 | 0.04331 | 0.04331 (MTES) | 0.00000 | 0.90880 | 0.47329 | 0.43551 (1-pentanol/2-ethoxyethanol) |
| 84 | 0.00008 | 0.00008 | 0.00880 (Triton X-45) | 0.06983 | 0.03143 | 0.03840 | 0.03840 (MTAS) | 0.00000 | 0.92120 | 0.52829 | 0.39291 |
| 85[5] | 0.00115 | 0.00006 | 0.00082 (L101) | 0.06249 | 0.02882 | 0.03367 | 0.03367 (MTES) | 0.00000 | 0.93532 | 0.65032 | 0.28501 |
| 86 | 0.00018 | 0.00009 | 0.00988 (Triton X-114) | 0.08029 | 0.03445 | 0.04583 | 0.04583 (MTES) | 0.00000 | 0.90956 | 0.46889 | 0.44067 |
| 87 | 0.00006 (TFA) | 0.00006 | 0.00655 (Triton X-114) | 0.07565 | 0.03783 | 0.03782 | 0.03782 (MTES) | 0.00000 | 0.91768 | 0.65077 | 0.26691 |
| 88 | 0.00068 | 0.00011 | 0.00185 (L81) | 0.07925 | 0.04359 (poly TEOS) | 0.03566 | 0.03566 (MTES) | 0.00000 | 0.91810 | 0.52478 | 0.39332 |
| 89 | 0.00012 | 0.00010 | 0.01093 (Triton X-114) | 0.06213 | 0.04438 | 0.01775 | 0.00888 (MTES) | 0.00887 (TMCTS) | 0.92672 | 0.51662 | 0.41011 |
| 90 | 0.00012 | 0.00011 | 0.00338 (Surf 485) | 0.06052 | 0.02119 | 0.03933 | 0.03933 (MTAS) | 0.00000 | 0.93585 | 0.54473 | 0.39113 (1-pentanol) |
| 91 | 0.00009 | 0.00009 | 0.00988 (Triton X-114) | 0.08029 | 0.03446 | 0.04584 | 0.04584 (MTES) | 0.00000 | 0.90964 | 0.46893 | 0.44071 |
| 92 | 0.00001 | 0.00001 | 0.00567 (L31) | 0.08119 | 0.03735 | 0.04384 | 0.04384 (MTES) | 0.00000 | 0.91312 | 0.47757 | 0.43555 |
| 93 | 0.00012 | 0.00012 | 0.00195 (L81) | 0.08799 | 0.05635 | 0.03164 | 0.03164 (MTES) | 0.00000 | 0.90982 | 0.56171 | 0.34811 |
| 94 | 0.00007 | 0.00007 | 0.00777 (Triton X-45) | 0.07708 | 0.03470 | 0.04238 | 0.04238 (MTAS) | 0.00000 | 0.91500 | 0.45259 | 0.46240 |
| 95 | 0.00006 | 0.00005 | 0.00088 (L81) | 0.06095 | 0.03289 | 0.02806 | 0.02806 (MTES) | 0.00000 | 0.93805 | 0.59878 | 0.33927 |

-continued

| Example # | MF HNO3 | MF TMAH | MF Surfactant | MF Total Silicon Source | MF TEOS | Total MF Hydrophobic Silicon Source | MF Hydrophobic Source 1 | MF Hydrophobic Source 2 | MF Total Solvent | MF Water | MF PGPE |
|---|---|---|---|---|---|---|---|---|---|---|---|
| 96 | 0.00007 | 0.00007 | 0.00778 (Triton X-45) | 0.06185 | 0.03094 | 0.03092 | 0.03092 (MTAS) | 0.00000 | 0.93023 | 0.58319 | 0.34704 |
| 97 | 0.00008 | 0.00006 | 0.00082 (L101) | 0.06257 | 0.02883 | 0.03374 | 0.03374 (MTES) | 0.00000 | 0.93647 | 0.65112 | 0.28535 |
| 98 | 0.00012 | 0.00011 | 0.01437 (Triton X-35) | 0.07578 | 0.04169 | 0.03409 | 0.03409 (MTAS) | 0.00000 | 0.90963 | 0.45762 | 0.45201 |
| 99 | 0.00012 | 0.00010 | 0.01414 (Triton X-35) | 0.07501 | 0.04877 | 0.02624 | 0.02624 (MTAS) | 0.00000 | 0.91063 | 0.46571 | 0.44492 |
| 100 | 0.00011 | 0.00009 | 0.00991 (Triton X-114) | 0.08046 | 0.03712 (DBDAS) | 0.04334 | 0.04334 (MTAS) | 0.00000 | 0.90944 | 0.47362 | 0.43582 (4-methyl-2-pentanol) |
| 101 | 0.00109 | 0.00006 | 0.00078 (L101) | 0.05917 | 0.02729 | 0.03188 | 0.03188 (MTES) | 0.00000 | 0.93890 | 0.61573 | 0.32317 (Dimethylformamide/PGPE) |
| 102 | 0.00009 | 0.00009 | 0.01012 (Triton X-114) | 0.06327 | 0.03340 | 0.02988 | 0.02672 (MTES) | 0.00316 (TSE-POSS) | 0.92642 | 0.48106 | 0.44536 |
| 103 | 0.00082 | 0.00009 | 0.00990 (Triton X-114) | 0.08039 | 0.03708 | 0.04331 | 0.04331 (MTES) | 0.00000 | 0.90880 | 0.47329 | 0.43551 (2-ethoxyethanol/PGMEA) |
| 104 | 0.00011 | 0.00009 | 0.00991 (Triton X-114) | 0.08046 | 0.03712 (DBDAS) | 0.04334 | 0.04334 (MTAS) | 0.00000 | 0.90944 | 0.47362 | 0.43582 (4-methyl-2-pentanol) |
| 105 | 0.00007 | 0.00007 | 0.00706 (Triton X-45) | 0.06961 | 0.02438 | 0.04524 | 0.04524 (MTAS) | 0.00000 | 0.92319 | 0.63050 | 0.29269 |
| 106 | 0.00115 | 0.00006 | 0.00082 (L101) | 0.06250 | 0.02880 | 0.03370 | 0.03370 (MTES) | 0.00000 | 0.93546 | 0.65041 | 0.28505 (2-ethoxyethylacetate/PGMEA) |
| 107 | 0.00080 | 0.00014 | 0.00229 (L81) | 0.09587 | 0.04314 (poly TEOS) | 0.05272 | 0.05272 (MTES) | 0.00000 | 0.90091 | 0.41573 | 0.48518 |
| 108 | 9.51E-05 | 0.00009 | 0.00918 (Triton X-45) | 0.06068 | 0.02731 | 0.03337 | 0.03337 (MTES) | 0.00000 | 0.92996 | 0.56594 | 0.36402 |
| 109 | 9.44E-05 | 0.00009 | 0.01009 (Triton X-114) | 0.06708 | 0.03690 | 0.03018 | 0.03018 (MTAS) | 0.00000 | 0.92263 | 0.64371 | 0.27892 |
| 110 | 9.28E-05 | 0.00009 | 0.00995 (Triton X-114) | 0.06127 | 0.02423 | 0.05653 | 0.01615 (FTES) | 0.04038 (MTES) | 0.90911 | 0.47156 | 0.43755 |
| 111 | 6.04E-05 | 0.00006 | 0.00081 (L101) | 0.07578 | 0.04369 | 0.01758 | 0.01264 (MTES) | 0.00494 (PTES) | 0.93781 | 0.63588 | 0.30193 |
| 112 | 0.00012 | 0.00011 | 0.01437 (Triton X-35) | 0.07578 | 0.04169 | 0.03409 | 0.03409 (MTAS) | 0.00000 | 0.90963 | 0.45762 | 0.45201 |
| 113 | 0.00011 | 0.00009 | 0.00991 (Triton X-114) | 0.08046 | 0.04169 | 0.04334 | 0.04334 (MTAS) | 0.00000 | 0.90944 | 0.47362 | 0.43582 (4-methyl-2-pentanol) |
| 114 | 0.00115 | 0.00006 | 0.00082 (L101) | 0.06250 | 0.02880 | 0.03370 | 0.03370 (MTES) | 0.00000 | 0.93546 | 0.65041 | 0.28505 |
| 115 | 0.00013 | 0.00013 | 0.01350 (Triton X-45) | 0.08925 | 0.04017 | 0.04908 | 0.04908 (MTAS) | 0.00000 | 0.89700 | 0.52385 | 0.37315 (2-ethoxyethylacetate/PGMEA) |
| 116 | 9.44E-05 | 9.43E-05 | 0.01009 (Triton X-45) | 0.06708 | 0.03690 | 0.03018 | 0.03018 (MTAS) | 0.00000 | 0.92263 | 0.64371 | 0.27892 |
| 117 | 9.28E-05 | 9.08E-05 | 0.00995 (Triton X-114) | 0.08076 | 0.02423 | 0.05653 | 0.01615 (FTES) | 0.04038 (MTES) | 0.90911 | 0.47156 | 0.43755 |

-continued

| Example # | MF HNO3 | MF TMAH | MF Surfactant | MF Total Silicon Source | MF TEOS | Total MF Hydrophobic Silicon Source | MF Hydrophobic Source 1 | MF Hydrophobic Source 2 | MF Total Solvent | MF Water | MF PGPE |
|---|---|---|---|---|---|---|---|---|---|---|---|
| 118 | 9.51E-05 | 8.58E-05 | 0.00918 (Triton X-45) | 0.06068 | 0.02731 | 0.03337 | 0.03337 (MTAS) | 0.00000 | 0.92996 | 0.56594 | 0.36402 |
| 119 | 6.81E-05 | 6.80E-05 | 0.00113 (L81) | 0.08638 | 0.04480 | 0.04158 | 0.04158 (DMDES) | 0.00000 | 0.91236 | 0.58808 | 0.32428 |
| 120 | 6.17E-05 | 6.15E-05 | 0.00082 (L101) | 0.06257 | 0.02883 | 0.03374 | 0.03374 (MTES) | 0.00000 | 0.93648 | 0.65113 | 0.28536 |
| 121 | 6.04E-05 | 6.03E-05 | 0.00081 (L101) | 0.06127 | 0.05491 | 0.00636 | 0.00421 (MTES) | 0.00214 (PTES) | 0.93781 | 0.63588 | 0.30193 |
| 122 | 0.00077 | 0.00010 | 0.00174 (L81) | 0.09703 | 0.04366 (poly TEOS) | 0.05336 | 0.05336 (MTES) | 0.00000 | 0.90036 | 0.42099 | 0.47937 |
| 123 | 0.00011 | 0.00011 | 0.00619 (Triton X-102) | 0.05637 | 0.03101 | 0.02536 | 0.02536 (MTAS) | 0.00000 | 0.93723 | 0.60096 | 0.33627 |
| 124 | 0.00087 | 0.00012 | 0.00197 (L81) | 0.06783 | 0.03660 | 0.03123 | 0.03123 (MTES) | 0.00000 | 0.92922 | 0.66607 | 0.26314 |
| 125 | 0.00008 | 0.00008 | 0.00228 (Surf 485) | 0.05938 | 0.03861 | 0.02077 | 0.02077 (MTES) | 0.00000 | 0.93819 | 0.58586 | 0.35232 |
| 126 | 0.00050 | 0.00007 | 0.00070 (L121) | 0.04034 | 0.01816 | 0.02218 | 0.02218 (MTES) | 0.00000 | 0.95839 | 0.23480 | 0.72358 (EtOH) |
| 127 | 0.00009 | 0.00009 | 0.01002 (Triton X-114) | 0.07323 | 0.02562 | 0.04761 | 0.04626 (MTES) | 0.00135 (TSE-POSS) | 0.91657 | 0.47595 | 0.44062 |
| 128 | 0.00011 | 0.00009 | 0.00998 (Triton X-114) | 0.07639 | 0.02918 | 0.04721 | 0.04255 (MTES) | 0.00466 (TMDEDS) | 0.91342 | 0.47431 | 0.43911 |
| 129 | 0.00123 (TFA) | 0.00011 | 0.01243 (Triton X-114) | 0.08098 | 0.03241 | 0.04858 | 0.04858 (MTES) | 0.00000 | 0.90525 | 0.65963 | 0.24562 |
| 130 | 0.00007 | 0.00007 | 0.00116 (L81) | 0.05739 | 0.03563 | 0.02176 | 0.02176 (DMDES) | 0.00000 | 0.94131 | 0.62060 | 0.32071 |
| 131 | 0.00012 | 0.00010 | 0.01072 (Triton X-114) | 0.08049 | 0.02610 | 0.05438 | 0.05221 (MTES) | 0.00218 (TMCTS) | 0.90858 | 0.50650 | 0.40208 |

1 = 0.063 mole fraction formamide
2 = 0.0016 mole fraction formamide
3 = 0.0026 mole fraction formic acid
4 = 0.0064 mole fraction formic acid
5 = 0.00015 mole fraction formamide
C1 bridge = bis(triethoxysilyl)methane

TABLE VII

PROPERTIES

| Example | Refractive Index | Thickness (Å) | Elastic Modulus (GPa) | Hardness (GPa) | Dielectric Constant | Normalized Wall Elastic Modulus (GPa) |
|---|---|---|---|---|---|---|
| 28 | 1.2053 | 7894.2 | 4.40 | 0.55 | 2.51 | 16.9 |
| 29 | 1.1896 | 4953.1 | 3.97 | 0.42 | 2.45 | 16.5 |
| 30 | 1.2359 | 7322.3 | 3.78 | 0.57 | 2.41 | 16.4 |
| 31 | 1.2289 | 6049.7 | 3.85 | 0.54 | 2.46 | 15.8 |
| 32 | 1.2437 | 6879.3 | 4.61 | 0.63 | 2.62 | 15.7 |
| 33 | 1.2281 | 10738.0 | 3.65 | 0.53 | 2.45 | 15.2 |
| 34 | 1.2293 | 5137.1 | 3.92 | 0.40 | 2.51 | 15.0 |
| 35 | 1.1938 | 4412.2 | 2.91 | 0.44 | 2.20 | 17.0 |
| 36 | 1.2178 | 5173.9 | 3.05 | 0.42 | 2.24 | 16.9 |
| 37 | 1.2027 | 7635.6 | 2.62 | 0.49 | 2.15 | 16.7 |
| 38 | 1.1563 | 3258.9 | 2.65 | 0.23 | 2.17 | 16.3 |
| 39 | 1.2334 | 6557.3 | 3.13 | 0.41 | 2.28 | 16.2 |
| 40 | 1.1530 | 4369.4 | 2.85 | 0.27 | 2.22 | 16.2 |
| 41 | 1.1694 | 8437.0 | 2.38 | 0.27 | 2.12 | 16.1 |
| 42 | 1.1929 | 6775.2 | 2.40 | 0.38 | 2.12 | 16.0 |
| 43 | 1.1917 | 7714.7 | 2.43 | 0.36 | 2.14 | 15.8 |
| 44 | 1.2001 | 9389.3 | 2.67 | 0.41 | 2.20 | 15.6 |
| 45 | 1.1634 | 8022.7 | 2.38 | 0.32 | 2.14 | 15.5 |
| 46 | 1.2104 | 8368.7 | 2.34 | 0.37 | 2.13 | 15.3 |
| 47 | 1.1882 | 4139.2 | 2.29 | 0.32 | 2.13 | 15.1 |
| 48 | 1.1980 | 9413.3 | 2.20 | 0.37 | 2.05 | 16.9 |
| 49 | 1.2070 | 6072.6 | 2.11 | 0.35 | 2.03 | 16.8 |
| 50 | 1.1516 | 8763.7 | 1.88 | 0.32 | 1.97 | 16.7 |
| 51 | 1.1736 | 8012.5 | 1.78 | 0.30 | 1.95 | 16.6 |
| 52 | 1.1504 | 3730.1 | 2.10 | 0.22 | 2.06 | 15.8 |
| 53 | 1.1382 | 3439.0 | 2.09 | 0.25 | 2.06 | 15.7 |
| 54 | 1.1427 | 5157.6 | 1.78 | 0.17 | 1.98 | 15.5 |
| 55 | 1.1735 | 11143.0 | 2.00 | 0.30 | 2.05 | 15.1 |
| 56 | 1.1780 | 7780.1 | 1.63 | 0.26 | 1.96 | 15.0 |
| 57 | 1.1836 | 7631.3 | 1.46 | 0.25 | 1.89 | 15.5 |
| 58 | 1.1929 | 10583.3 | 1.58 | 0.32 | 1.89 | 16.9 |
| 59 | 1.1749 | 7898.4 | 1.57 | 0.26 | 1.89 | 16.9 |
| 60 | 1.1558 | 7956.5 | 1.55 | 0.27 | 1.88 | 16.9 |
| 61 | 1.1613 | 7147.5 | 1.49 | 0.25 | 1.87 | 16.6 |
| 62 | 1.1606 | 5052.4 | 1.46 | 0.21 | 1.86 | 16.7 |
| 63 | 1.1644 | 6389.5 | 1.32 | 0.23 | 1.84 | 16.0 |
| 64 | 1.1528 | 9033.2 | 1.27 | 0.26 | 1.83 | 15.8 |
| 65 | 1.1505 | 6488.2 | 1.27 | 0.14 | 1.81 | 16.4 |
| 66 | 1.1379 | 7688.8 | 0.95 | 0.13 | 1.74 | 15.3 |
| 67 | 1.1380 | 6345.2 | 0.87 | 0.14 | 1.70 | 15.7 |
| 68 | 1.1341 | 4468.8 | 0.82 | 0.09 | 1.69 | 15.3 |
| 69 | 1.1153 | 5136.9 | 0.68 | 0.11 | 1.62 | 16.8 |
| 70 | 1.2473 | 4567.5 | 4.96 | 0.72 | 2.47 | 19.9 |
| 71 | 1.1754 | 6747.4 | 4.53 | 0.31 | 2.51 | 17.4 |
| 72 | 1.2202 | 4843.2 | 3.60 | 0.45 | 2.24 | 19.9 |
| 73 | 1.1978 | 4376.0 | 2.93 | 0.38 | 2.13 | 19.5 |
| 74 | 1.1905 | 6697.4 | 4.00 | 0.52 | 2.35 | 18.9 |
| 75 | 1.1473 | 2954.9 | 2.77 | 0.22 | 2.13 | 18.4 |
| 76 | 1.1745 | 9392.5 | 2.67 | 0.37 | 2.13 | 17.7 |
| 77 | 1.1668 | 4531.9 | 2.72 | 0.33 | 2.15 | 17.2 |
| 78 | 1.1926 | 3979.9 | 2.75 | 0.35 | 2.17 | 17.0 |
| 79 | 1.1716 | 8731.7 | 2.68 | 0.36 | 2.06 | 19.9 |
| 80 | 1.1944 | 5046.3 | 2.44 | 0.38 | 2.02 | 19.6 |
| 81 | 1.1860 | 11003.4 | 2.51 | 0.42 | 2.05 | 19.3 |
| 82 | 1.1602 | 9040.5 | 2.25 | 0.30 | 2.00 | 18.8 |
| 83 | 1.1616 | 12559.5 | 2.42 | 0.40 | 2.06 | 18.1 |
| 84 | 1.1671 | 3271.4 | 2.12 | 0.18 | 2.01 | 17.4 |
| 85 | 1.1961 | 9667.3 | 2.27 | 0.38 | 2.06 | 17.1 |
| 86 | 1.1737 | 8101.1 | 1.68 | 0.30 | 1.86 | 19.1 |
| 87 | 1.1673 | 6889.2 | 1.64 | 0.33 | 1.87 | 18.4 |
| 88 | 1.1724 | 10696.4 | 1.51 | 0.26 | 1.84 | 18.1 |
| 89 | 1.1107 | 5736.0 | 1.06 | 0.10 | 1.73 | 17.7 |
| 90 | 1.1800 | 5639.7 | 1.57 | 0.28 | 1.88 | 17.0 |
| 91 | 1.1434 | 4925.0 | 1.07 | 0.16 | 1.70 | 19.6 |
| 92 | 1.1382 | 4777.4 | 0.72 | 0.11 | 1.60 | 18.8 |
| 93 | 1.1127 | 4569.7 | 0.68 | 0.08 | 1.59 | 18.5 |
| 94 | 1.2293 | 4433.8 | 3.63 | 0.50 | 2.11 | 24.9 |
| 95 | 1.2180 | 7107.7 | 3.53 | 0.42 | 2.14 | 22.8 |
| 96 | 1.1741 | 4192.8 | 3.65 | 0.29 | 2.21 | 21.1 |
| 97 | 1.1811 | 11205.3 | 3.00 | 0.48 | 2.12 | 20.1 |
| 98 | 1.1657 | 3126.1 | 3.62 | 0.47 | 1.94 | 35.0 |
| 99 | 1.2060 | 5507.7 | 3.59 | 0.46 | 2.09 | 25.2 |

TABLE VII-continued

PROPERTIES

| Example | Refractive Index | Thickness (Å) | Elastic Modulus (GPa) | Hardness (GPa) | Dielectric Constant | Normalized Wall Elastic Modulus (GPa) |
|---|---|---|---|---|---|---|
| 100 | 1.1568 | 2574.9 | 2.24 | 0.20 | 1.92 | 22.3 |
| 101 | 1.1968 | 6666.4 | 2.46 | 0.38 | 1.97 | 21.9 |
| 102 | 1.1283 | 3180.3 | 2.49 | 0.25 | 2.00 | 21.0 |
| 103 | 1.1661 | 11837.0 | 2.28 | 0.38 | 1.97 | 20.2 |
| 104 | 1.1584 | 2311.4 | 3.23 | 0.22 | 1.90 | 34.0 |
| 105 | 1.2347 | 6800.1 | 2.70 | 0.50 | 1.87 | 30.5 |
| 106 | 1.1813 | 12854.2 | 2.43 | 0.45 | 1.86 | 27.7 |
| 107 | 1.1714 | 10789.4 | 1.50 | 0.29 | 1.79 | 20.7 |
| 108 | 1.1929 | 4896.7 | 2.23 | 0.30 | 1.58 | 63.6 |
| 109 | 1.1955 | 9906.3 | 2.56 | 0.40 | 1.67 | 51.6 |
| 110 | 1.1571 | 6805.2 | 1.79 | 0.21 | 1.62 | 42.7 |
| 111 | 1.1224 | 4064.3 | 1.12 | 0.09 | 1.64 | 24.7 |
| 112 | 1.1657 | 3126.1 | 3.62 | 0.47 | 1.94 | 35.0 |
| 113 | 1.2347 | 6800.1 | 3.23 | 0.22 | 1.90 | 34.0 |
| 114 | 1.1813 | 12854.2 | 2.43 | 0.45 | 1.86 | 27.7 |
| 115 | 1.2046 | 7420.7 | 2.54 | 0.40 | 1.91 | 26.0 |
| 116 | 1.1766 | 6334.4 | 2.56 | 0.40 | 1.67 | 51.6 |
| 117 | 1.2076 | 7594.5 | 1.79 | 0.21 | 1.62 | 42.7 |
| 118 | 1.1929 | 4896.7 | 2.23 | 0.30 | 1.58 | 63.6 |
| 119 | 1.0831 | 3224.8 | 3.27 | 0.15 | 1.77 | 47.2 |
| 120 | 1.1544 | 6326.6 | 0.70 | 0.11 | 1.46 | 37.3 |
| 121 | 1.1134 | 2519.2 | 2.09 | 0.10 | 1.74 | 33.0 |
| 122 | 1.1849 | 11115.6 | 1.75 | 0.27 | 1.99 | 15.0 |
| 123 | 1.1581 | 7550.0 | 1.62 | 0.24 | 1.97 | 14.7 |
| 124 | 1.1746 | 13043.4 | 1.62 | 0.27 | 1.97 | 14.4 |
| 125 | 1.1536 | 4939.7 | 1.65 | 0.21 | 2.00 | 13.9 |
| 126 | 1.1503 | 7837.0 | 1.30 | 0.19 | 1.90 | 13.5 |
| 127 | 1.1641 | 6839.5 | 1.24 | 0.22 | 1.90 | 12.9 |
| 128 | 1.1727 | 7375.0 | 1.41 | 0.25 | 1.97 | 12.7 |
| 129 | 1.1523 | 11316.2 | 1.00 | 0.21 | 1.85 | 11.9 |
| 130 | 1.1487 | 9448.0 | 1.27 | 0.18 | 1.99 | 10.8 |
| 131 | 1.1613 | 7764.5 | 1.22 | 0.21 | 2.00 | 10.4 |

Comparison of Normalized Wall Modullus for Different Surfactant Levels and for Different Ratios of Hydraulic to Hydrophobic Si Sources Sample films, having four different surfactant levels and 3 different ratios of Si sources, were prepared in the same manner as Example 1 and the normalized wall modulus was calculated for each film using the procedures described herein. Each film was formed from a mixture having TRI-TON™ X-114 as the surfactant, TEOS and MTES as the silica sources, PGPE as the solvent, and TMAH as the ionic additive. The following ratios were kept constant: APPROX_PH [−log[(moles acid−moles base)/(kg water+kg solvent)]]=1.89, TMAH/Si=0.0011, H$_2$O/Si=5.87, PGPE/Si=4.52. Table VII provides the values for the various films.

TABLE VIII

CHANGING VOID FRACTION BY VARYING SURFACTANT LEVEL

| Example | Surfactant/Si, mol ratio | MTES/Si, mol ratio | K | Elastic modulus (GPa) | Calculated void fraction | E$_0$' (GPa) |
|---|---|---|---|---|---|---|
| A | 0.049 | 0.636 | 2.49 | 3.36 | 0.46 | 13.16 |
| B | 0.074 | 0.636 | 2.29 | 2.46 | 0.53 | 12.67 |
| C | 0.099 | 0.636 | 2.12 | 1.74 | 0.58 | 11.66 |
| D | 0.123 | 0.636 | 1.94 | 1.51 | 0.64 | 14.27 |
| E | 0.049 | 0.545 | 2.60 | 3.97 | 0.43 | 13.71 |
| F | 0.049 | 0.455 | 2.72 | 4.21 | 0.39 | 12.83 |
| G | 0.074 | 0.545 | 2.28 | 2.42 | 0.53 | 12.50 |
| H | 0.074 | 0.455 | 2.44 | 3.12 | 0.48 | 13.04 |
| I | 0.099 | 0.545 | 2.17 | 2.06 | 0.57 | 12.78 |
| J | 0.099 | 0.455 | 2.23 | 2.51 | 0.54 | 14.10 |
| K | 0.123 | 0.545 | 2.05 | 1.59 | 0.60 | 12.10 |
| L | 0.123 | 0.455 | 2.18 | 1.98 | 0.56 | 12.04 |
| Average | | | | | | 12.91 |
| Std. Dev. | | | | | | 0.81 |

Figure 2:
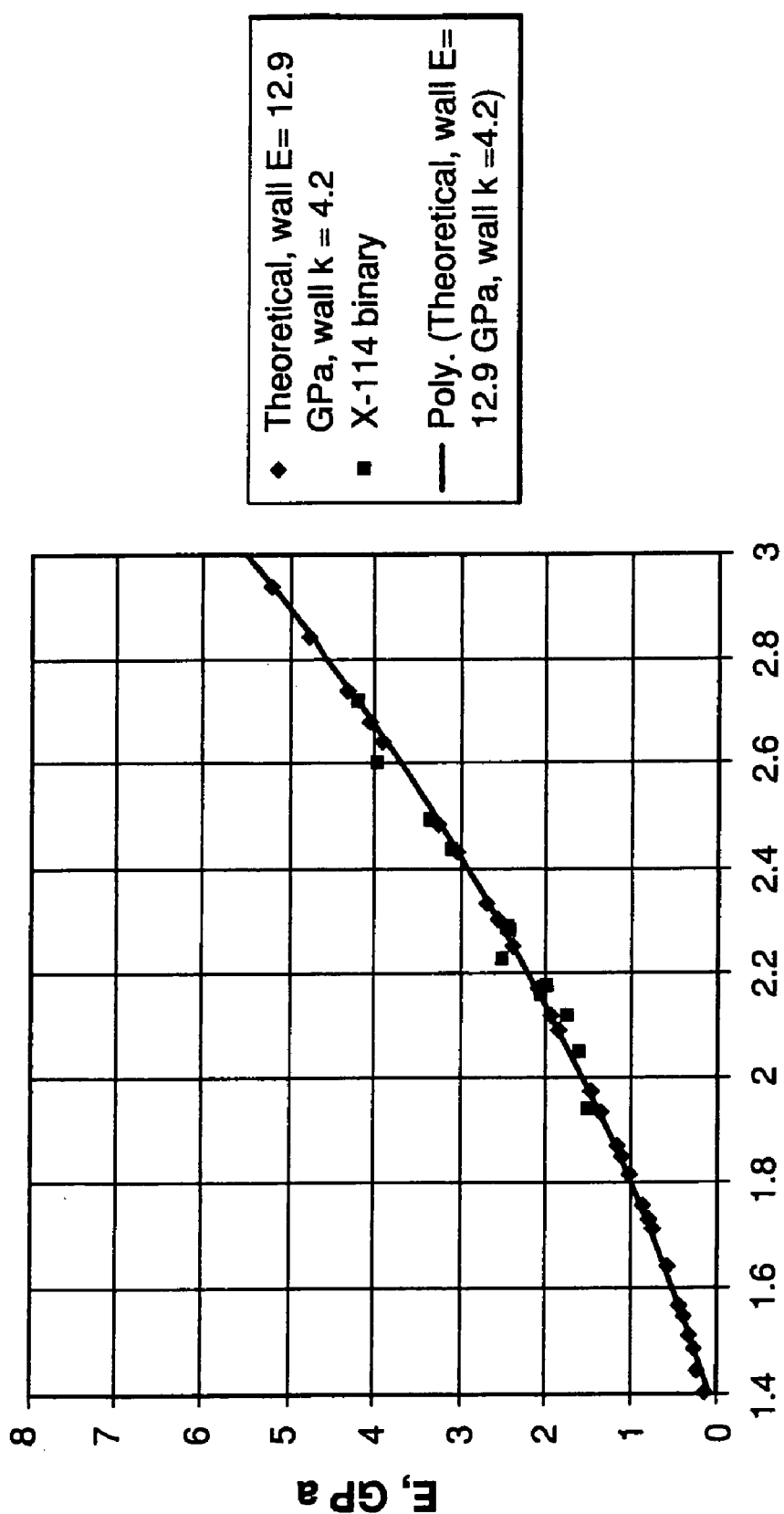
FIG. 2 provides a comparison of the theoretical modulus vs. κ curve for a wall κ of 4.2 and a wall elastic modulus of 12.9 GPa to the data points from Table VIII that illustrates the effect of varying the amount of surfactant on the material.

The average of the E$_0$' and a wall κ of 4.2 were then used to construct a modulus vs. κ curve by varying void fraction using the calculations described herein, i.e., Maxwell equation for k; Day et al.'s 2-d circular hole model for elastic modulus extended to 3-d cylindrical pores with the modulus measured perpendicular to the pore axes. FIG. 2 compares the theoretical modulus vs. κ curve for a wall κ of 4.2 and a wall elastic modulus of 12.9 GPa and the data for the four different surfactant levels and three different ratios of Si sources.

As FIG. 2 illustrates, the experimental points follow the theoretical curve very closely. The porosity can be varied to select a material that has a more advantageous dielectric constant and elastic modulus. This may be attributed to the changing void fraction, i.e., increasing the void fraction decreases the elastic modulus and the dielectric constant. This example demonstrates that one can move up and down the curve by changing surfactant level to prepare a material that has the dielectric constant for a given application.

Comprasion of Normalized Wall Modullus for Different Amounts of Solvent

The normalized wall elastic modulus was calculated for materials prepared using differing amounts of solvent. The data for elastic modulus and dielectric constant was obtained from information provided in the article, Ramos et al. "Mechanical and Electrical Properties of NANOGLASS™ Nanoporous Silica as a Function of Porosity", June 2001. These data points are as follows: κ=1.95 and elastic modulus=4.3 GPa; κ=2.05 and elastic modulus=5.5 GPa; κ=2.24 and elastic modulus=6.1 GPa; κ=2.38 and elastic modulus=9.1 GPa. The normalized wall elastic modulus was calculated using the method described herein. FIG. 3 provides a comparison between the theoretical modulus vs. κ curve for a wall κ of 4.2 and a wall elastic modulus of 41 GPa to data points from the literature.

This example demonstrates that one can move up and down the curve by changing solvent level to prepare a material that has the dielectric constant for a given application.

Comparative Examples

Figure 4:
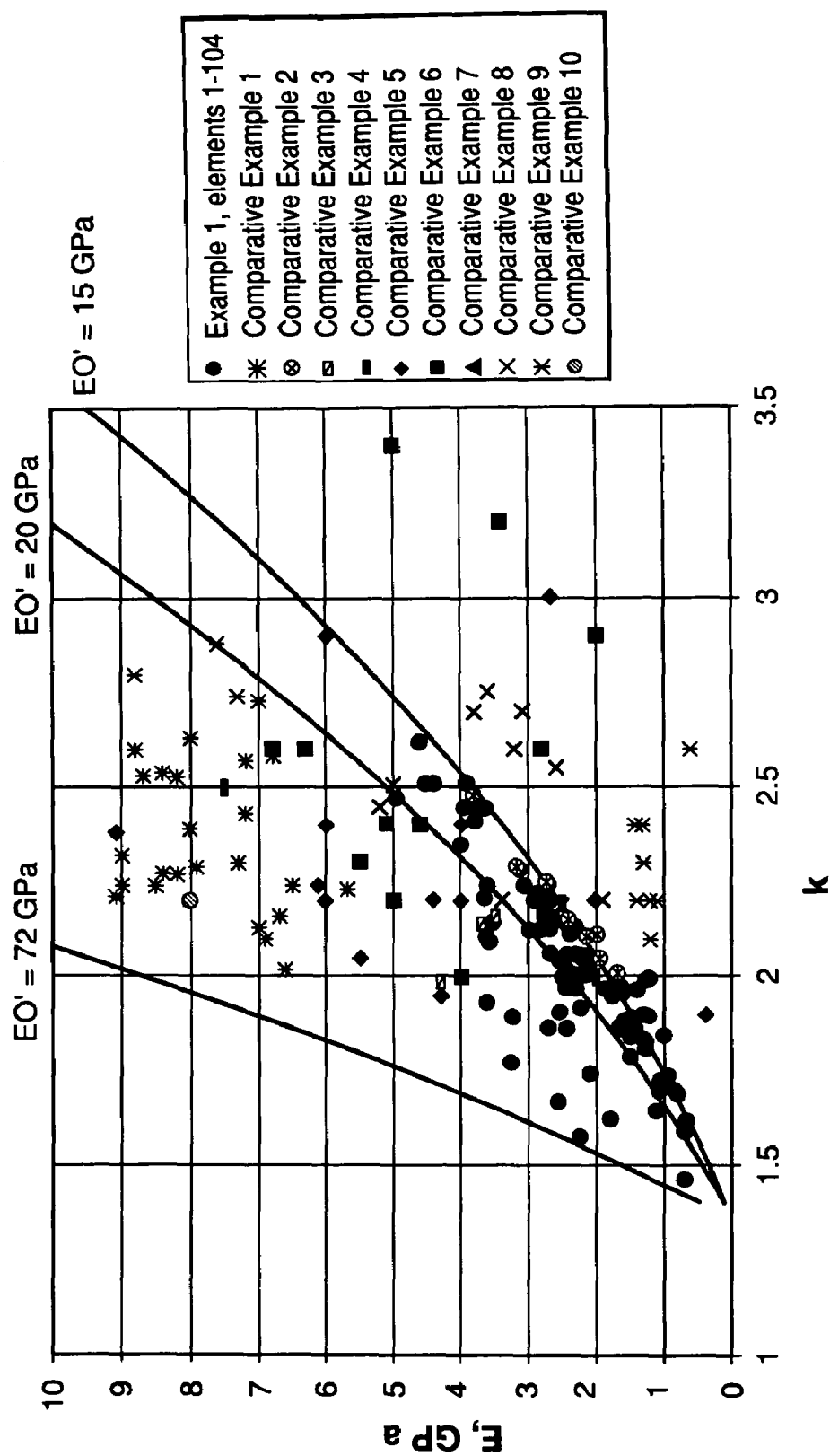
FIG. 4 provides a comparison between the dielectric films of the present invention from Table VII and the dielectric films of the prior art using the values provided in Table IX and theoretical curves based on $E_0'$ of 15, 20, and 72 GPa.

A survey of prior art, spin-on porous silica-based thin films, in which the values for dielectric constant and Young's modulus are known, was conducted and the normalized wall elastic modulus was calculated. The results of this survey are provided in Table IX. Table IX also provides the activation time, activation temperatures, and metal impurity level for each film, if provided within the reference. FIG. 4 provides a comparison between the dielectric films of the present invention using array examples 28 through 131 and the dielectric films of the prior art using theoretical curves based on $E_0'$ of 15, 20, and 72 GPa and the values provided in Table IX.

As Table IX and FIG. 4 illustrate, none of the prior art films have a κ less than about 1.95 and an $E_0'$ greater than about 26 GPa. For films with dielectric constants below about 2.5 but greater than 2, $E_0'$ averages about 15 G Pa for the Comp. Ex. 2 films, and less than 9 GPa for the Comp. Ex. 1 films. The Comp. Ex. 6 films have dielectric constants greater than about 2 and $E_0'$ as high as 33.6 GPa. The Comp. Ex. 5 films have dielectric constants greater than about 1.95 and $E_0'$ as high as 41.9 GPa. Comp. Ex. 4 films have dielectric constants greater than about 2 and $E_0'$ as high as 29 GPa. Only the Comp. Ex. 2 films were reported to have metal contents less than about 500 ppm.

For films with dielectric constants below 1.95, the Comp. Ex. 5 films had an E0' of 4.2 GPa, the Comp. Ex. 7 films have E0' as high as 25.8 GPa. None of these films were reported to have metal contents less than about 500 ppm. Therefore, it could not be anticipated that the dielectric and mechanical properties of the prior art materials reported herein would be maintained when the reagents are purified. Moreover, none of these films also had cure temperatures of less than 450° C. and cure times less than 30 minutes.

TABLE IX

COMPARATIVE EXAMPLES FOR SPIN-ON LOW K SILICA BASED FILMS

| Comparison Film | Si Source | Catalyst | Ionic Additive | Porogen | Solvent | Cure Temp. | Cure Time | Metal Analysis? | Elastic Modulus (GPa) | K | E0' (GPa) |
|---|---|---|---|---|---|---|---|---|---|---|---|
| Comp. Ex. 1 (1) | Fluororesins | | | | | 400° C. | 60 min. | No | 1.2 | 2.2 | 7.1 |
| | | | | | | | | | 1.2 | 2.2 | 7.1 |
| | | | | | | | | | 1.2 | 2.1 | 8.3 |
| | | | | | | | | | 1.2 | 2.2 | 7.1 |
| | | | | | | | | | 1.3 | 2.3 | 6.6 |
| | | | | | | | | | 1.4 | 2.4 | 6.2 |
| | | | | | | | | | 1.2 | 2.2 | 7.1 |
| | | | | | | | | | 1.3 | 2.4 | 5.7 |
| | | | | | | | | | 1.2 | 2.1 | 8.3 |
| | | | | | | | | | 1.4 | 2.2 | 8.2 |
| | | | | | | | | | 1.1 | 2.2 | 6.5 |
| | | | | | | | | | 0.6 | 2.6 | 2.1 |
| | | | | | | | | | 0.6 | | 0 |
| | | | | | | | | | 1.2 | 2.1 | 8.3 |
| Comp. Ex. 2 (2) | TEOS/MTES | HN03 | TMAH | Surfactant (Triton) | PGPE | 400° C. | 3 min. | Yes | 3.82 | 2.48 | 15.2 |
| | | | | | | | | | 2.74 | 2.25 | 14.9 |
| | | | | | | | | | 1.98 | 2.11 | 13.5 |
| | | | | | | | | | 3.17 | 2.29 | 16.3 |
| | | | | | | | | | 2.41 | 2.15 | 15.4 |
| | | | | | | | | | 1.94 | 2.05 | 14.8 |
| | | | | | | | | | 2.7 | 2.24 | 14.9 |
| | | | | | | | | | 2.1 | 2.11 | 14.4 |
| | | | | | | | | | 1.69 | 2.01 | 13.9 |
| Comp Ex. 4 3 (3) | | | | | | 350° C. | Not reported | No | 3.5 | 2.15 | 22.3 |
| | | | | | | | | | 3.7 | 2.13 | 24.4 |
| | | | | | | | | | 4.3 | 1.98 | 37.7 |

TABLE IX-continued

COMPARATIVE EXAMPLES FOR SPIN-ON LOW K SILICA BASED FILMS

| Comparison Film | Si Source | Catalyst | Ionic Additive | Porogen | Solvent | Cure Temp. | Cure Time | Metal Analysis? | Elastic Modulus (GPa) | K | E0' (GPa) |
|---|---|---|---|---|---|---|---|---|---|---|---|
| Comp. Ex. 4 (4)(5) | HSQ | | | High b.p. solvent (tetra-decane?) | | 450° C. | 60 min. | No | 7.5 | 2.5 | 29.2 |
| | | | | | | | | | 2 | 2 | 16.8 |
| | | | | | | | | | 2.5 | 2.19 | 14.9 |
| Comp. Ex. 5 (6)(7)(8) | TEOS | | | High b.p. solvent (glycerol, ethylene glycol?) | EtOH | 450° C. | 30 min. | No | 0.4 | 1.9 | 4.2 |
| | TEOS | | | High b.p. solvent (glycerol, ethylene glycol?) | EtOH | 450° C. | 30 min. | No | 2 | 2.2 | 11.8 |
| | TEOS | | | High b.p. solvent (glycerol, ethylene glycol?) | EtOH | 450° C. | 30 min. | No | 4 | 2.4 | 17.6 |
| | | | | | | | | | 6 | 2.4 | 26.4 |
| | | | | | | | | | 4 | 2.2 | 23.5 |
| | | | | | | | | | 6 | 2.2 | 35.3 |
| | TEOS/MTAS | | | Polyethylene glycol meno-methyl-ether (PEG-MME) | Acetone | 125° C. | 30 min. | No | 4 | 2.2 | 23.5 |
| | | | | | | | | | 6 | 2.2 | 35.3 |
| | | | | | | | | | 4 | 2.2 | 23.5 |
| | | | | | | | | | 6 | 2.2 | 35.3 |
| | | | | | | | | | 4.3 | 1.95 | 40.1 |
| | | | | | | | | | 5.5 | 2.05 | 41.9 |
| | | | | | | | | | 6.1 | 2.24 | 33.7 |
| | | | | | | | | | 9.1 | 2.38 | 41.2 |
| | | | | | | | | | 4.4 | 2.2 | 25.9 |
| | | | | | | | | | 5.68 | 3 | 13.3 |
| Comp. Ex. 6 (9)(10)(11) | MTMS | Ti(acac) | | High p.b. solvent/acac? | | 450° C. | 60 min. | Yes | | | |
| | MTMS/TMOS/bridge | Ti(acac) or maleic acid | | Acac/PIMA/PEG? | PGPE | 450° C. | 70 min. | Yes | | | |
| | MTMS/TEOS | 2-part, NH3/HOAc, Ti(acac) | | Acac? | PGPE | 425° C. | 60 min. | No | 4.6 | 2.4 | 20.3 |
| | | | | | | | | | 6.3 | 2.6 | 21.8 |
| | | | | | | | | | 3.4 | 3.2 | 6.8 |
| | MTMS/TEOS | 2-part, NH3/HOAc, maleic acid | | Methyl n-pentyl ketone? | PGPE | 425° C. | 60 min. | No | 5.1 | 2.4 | 22.5 |
| | | | | | | | | | 6.8 | 2.6 | 23.6 |
| | | | | | | | | | 5 | 3.4 | 8.6 |
| | MTMS/TEOS | NH3/HOAc or MMA/HOAc | | HOAc? | PGPE | 400° C. | 30 min. | No | 5.5 | 2.3 | 27.8 |
| | | | | | | | | | 5 | 2.2 | 29.4 |
| | | | | | | | | | 4 | 2 | 33.6 |
| | | | | | | | | | 2.8 | 2.6 | 9.7 |
| | | | | | | | | | 2 | 2.9 | 5.1 |
| Comp. Ex. 9 (12) | MSQ (Techneglass) | | | Surfactant (Pluronic) | n-butanol | 500° C. | 2 hours | No | 3 | 2.04 | 23.3 |

TABLE IX-continued

COMPARATIVE EXAMPLES FOR SPIN-ON LOW K SILICA BASED FILMS

| Comparison Film | Si Source | Catalyst | Ionic Additive | Porogen | Solvent | Cure Temp. | Cure Time | Metal Analysis? | Elastic Modulus (GPa) | K | E0' (GPa) |
|---|---|---|---|---|---|---|---|---|---|---|---|
| | | | | | | | | | 1.3 | 1.75 | 20.2 |
| | | | | | | | | | 0.6 | 1.5 | 25.8 |
| | | | | | | | | | 2.7 | 2 | 22.7 |
| Comp. Ex. 8 (13)(14)(15) | | | | | | | | No | 3.1 | 2.7 | 9.7 |
| | | | | | | | | | 3.2 | 2.6 | 11.1 |
| | | | | | | | | | 3.6 | 2.75 | 10.7 |
| | | | | | | | | | 5.2 | 2.45 | 21.5 |
| | | | | | | | | | 5 | 2.51 | 19.2 |
| | | | | | | | | | 60 | 4.1 | 64.1 |
| | | | | | | | | | 33 | 3.3 | 61.0 |
| | | | | | | | | | 3.8 | 2.7 | 11.8 |
| | | | | | | | | | 2.6 | 2.55 | 9.5 |
| | | | | | | | | | 2.5 | 2.19 | 14.9 |
| | | | | | | | | | 1.9 | 2.2 | 11.2 |
| | | | | | | | | | 3.4 | 2.2 | 20.0 |
| Comp. Ex. 9 (16) | | | | | | | | No | 7.3 | 2.3 | 36.9 |
| | | | | | | | | | 7 | 2.13 | 46.2 |
| | | | | | | | | | 8.2 | 2.27 | 43.3 |
| | | | | | | | | | 7.9 | 2.29 | 40.5 |
| | | | | | | | | | 6.7 | 2.16 | 42.0 |
| | | | | | | | | | 6.5 | 2.24 | 35.9 |
| | | | | | | | | | 8.8 | 2.8 | 24.8 |
| | | | | | | | | | 7.6 | 2.88 | 19.9 |
| | | | | | | | | | 7.2 | 2.57 | 25.8 |
| | | | | | | | | | 7.2 | 2.43 | 30.5 |
| | | | | | | | | | 6.8 | 2.59 | 23.8 |
| | | | | | | | | | 7.3 | 2.74 | 21.8 |
| | | | | | | | | | 7 | 2.73 | 21.1 |
| | | | | | | | | | 6.9 | 2.1 | 48.0 |
| | | | | | | | | | 6.6 | 2.02 | 53.3 |
| | | | | | | | | | 8.8 | 2.6 | 30.5 |
| | | | | | | | | | 9 | 2.32 | 44.2 |
| | | | | | | | | | 8.2 | 2.27 | 43.3 |
| | | | | | | | | | 5.7 | 2.23 | 32.0 |
| | | | | | | | | | 8.5 | 2.24 | 46.9 |
| | | | | | | | | | 9.1 | 2.21 | 52.6 |
| | | | | | | | | | 9 | 2.24 | 49.7 |
| | | | | | | | | | 8.4 | 2.27 | 44.3 |
| | | | | | | | | | 8 | 2.39 | 35.7 |
| | | | | | | | | | 8 | 2.63 | 26.8 |
| | | | | | | | | | 8.2 | 2.53 | 30.8 |
| | | | | | | | | | 8.4 | 2.54 | 31.1 |
| | | | | | | | | | 8.7 | 2.53 | 32.6 |
| Comp. Ex. 10 (17) | | | | | | | | No | 8 | 2.2 | 47.0 |

(1) See U.S. Pat. No. 5,905,117
(2) See EP 1,123,753 assigned to same assignee as present invention
(3) See Brinker, et al., "Evaporation-Induced Self Assembly of Hybrid Bridged Silsesquioxane Film and Particulate Mesophases with Integral Organic Functionality:, J. Am. Chem., Soc. 200, 122, pp. 5258-5261
(4) See Golden et al., "Designing Porous Low K Dielectrics", Semiconductor International, May 2001
(5) See Jin et al., "Characterization and Integration of Porous Extra Low-k (XLK) Dielectrics", International Interconnect Technology Conference", June 2001
(6) See Ramos et al. "Mechanical and Electrical Properties of NANOGLASS ™ Nanoporous Silica as a Function of Porosity", June 2001
(7) See Thomas, M. E., "Spin-on Stacked Films for Low-keff Dielectrics", Solid State Technology, July 2001
(8) See Thanawala et al., "Reduction in the Effective Dielectric Constant of Integrated Interconnect Structures through an All Spin-on Strategy", Honeywell Technical Reports
(9) See EP 1,088,868
(10) See EP 1,090,967
(11) See EP 1,127,929
(12) See Yang et al., "Nanoporous Ultralow Dielectric Constant Organosilicates Templated by Triblock Copolymers, Chem. Mater. 2002, 14, pp. 369-374
(13) See Cook et al., "Stress-Corrosion Cracking of Low Dielectric Constant Spin-On Glass Thin Films", J. Electrochem. Soc. 1999, 146(12), pp. 4439-4448
(14) Ro et al., "Synthesis and Characterization of Polysilsesquioxane Copolymers for Low Dielectric Applications", Polymer Preprints 2001, 42(2), p. 889
(15) Wang et al., "Advanced Processing: CMP of Cu/low-K and Cu/ultralow-K Layers", Solid State Technology, September 2001
(16) Berry et al., "Plasma Curing Process for Porous Silica thin Film" U.S. Patent Appl. Pub. No. US 2001/0038919 A1, Nov. 8, 2001
(17) LaPedus, M., "Startup Claims Radical approach to Low-k Insulators in Copper Chips", Silicon Strategies, Apr. 5, 2002

The invention claimed is:

1. A low dielectric material, the material having:
   a dielectric constant of about 3.7 or less;
   a normalized wall elastic modulus (E0'), derived in part from the dielectric constant of the material, of about 15 GPa or greater; and
   a metal impurity level of about 500 ppm or less.

2. The material of claim 1 wherein the dielectric constant is about 2.7 or less.

3. The material of claim 2 wherein the dielectric constant is about 2.4 or less.

4. The material of claim 3 wherein the dielectric constant is about 2.1 or less.

5. The material of claim 4 wherein the dielectric constant is about 1.9 or less.

6. The material of claim 5 wherein the dielectric constant is about 1.7 or less.

7. The material of claim 1 wherein the normalized wall elastic modulus is about 17 GPa or greater.

8. The material of claim 7 wherein the normalized wall elastic modulus is about 20 GPa or greater.

9. The material of claim 1 wherein the material comprises at least one silica.

10. The material of claim 9 wherein the diffraction pattern of the material does not exhibit diffraction peaks at a d-spacing greater than 10 Angstroms.

11. The material of claim 9 wherein the material comprises a plurality of Si—C bonds.

12. The material of claim 11 wherein the ratio of the total number of Si—C bonds to the total number of Si atoms ranges from between about 20 to about 80 mole percent.

13. The material of claim 12 wherein the ratio of the total number of Si—C bonds to the total number of Si atoms ranges from between about 40 to about 60 mole percent.

14. The material of claim 1 wherein the material is porous.

15. The material of claim 14 wherein the material is mesoporous.

16. The material of claim 14 wherein the material has a porosity of about 10 to about 90%.

17. The material of claim 14 wherein the material has a porosity of about 40 to about 85%.

18. The material of claim 1 wherein the metal impurity level is about 100 ppb or less.

19. The material of claim 18 wherein the metal impurity level is about 10 ppb or less.

20. A low dielectric film comprising the material of claim 1.

21. The film of claim 20 wherein the thickness ranges from between about 0.05 to about 2.0 μm.

22. A low dielectric material having a dielectric constant of less than about 1.95 and a normalized wall elastic modulus ($E_0'$), derived in part from the dielectric constant of the material, of greater than about 26 GPa.

23. The material of claim 22 wherein the dielectric constant is about 1.9 or less.

24. The material of claim 23 wherein the dielectric constant is about 1.7 or less.

25. The material of claim 22 wherein the material is porous.

26. The material of claim 25 wherein the material is mesoporous.

27. The material of claim 25 wherein the material has a porosity of about 40 to about 85%.

28. The material of claim 22 wherein the material comprises at least one silica.

29. The material of claim 28 wherein the diffraction pattern of the material does not exhibit diffraction peaks at a d-spacing greater than 10 Angstroms.

30. The material of claim 28 wherein the diffraction pattern of the material does exhibit diffraction peaks.

31. The material of claim 28 wherein the material comprises a plurality of Si—C bonds.

32. The material of claim 31 wherein the ratio of the total number of the Si—C bonds to the total number of Si atoms ranges from between about 20 to about 80 mole percent.

33. The material of claim 32 wherein the ratio of the total number of the Si—C bonds to the total number of Si atoms ranges from between about 40 to about 60 mole percent.

34. The material of claim 22 wherein the material has a metal impurity level of about 500 ppm or less.

35. The material of claim 34 wherein the metal impurity level is about 100 ppb or less.

36. The material of claim 35 wherein the metal impurity level is about 10 ppb or less.

37. A low dielectric film comprising the material of claim 22.

38. The film of claim 37 wherein the thickness ranges from between about 0.05 to about 2.0 μm.

39. A low dielectric material, the material having:
   a dielectric constant of about 2.0 or less;
   a normalized wall elastic modulus ($E_0'$), derived in part from the dielectric constant of the material, that ranges between about 5 GPa and about 15 GPa; and
   a metal impurity level of about 500 ppm or less.

40. The material of claim 39 wherein the normalized wall elastic modulus ranges from between about 10 GPa to about 15 GPa.

41. The material of claim 39 wherein the dielectric constant is about 1.9 or less.

42. The material of claim 41 wherein the dielectric constant is about 1.7 or less.

43. The material of claim 39 wherein the material is porous.

44. The material of claim 43 wherein the material is mesoporous.

45. The material of claim 43 wherein the material has a porosity of about 40 to about 85%.

46. The material of claim 39 wherein the material comprises at least one silica.

47. The material of claim 46 wherein the diffraction pattern of the material does not exhibit diffraction peaks at a d-spacing greater than 10 Angstroms.

48. The material of claim 46 wherein the diffraction pattern of the material does exhibit diffraction peaks.

49. The material of claim 46 wherein the material comprises a plurality of Si—C bonds.

50. The material of claim 49 wherein the ratio of the total number of the Si—C bonds to the total number of Si atoms ranges from between about 20 to about 80 mole percent.

51. The material of claim 50 wherein the ratio of the total number of the Si—C bonds to the total number of Si atoms ranges from between about 40 to about 60 mole percent.

52. The material of claim 39 wherein the metal impurity level is about 100 ppb or less.

53. The material of claim 52 wherein the metal impurity level is about 10 ppb or less.

54. A low dielectric film comprising the material of claim 39.

55. The film of claim 54 wherein the thickness ranges from between about 0.05 to about 2.0 µm.

56. A low dielectric material, the material comprising:
 at least one silica having a plurality of Si—C bonds wherein the total number of the Si—C bonds to the total number of Si atoms ranges from about 20 to about 80 mole percent;
 an elastic modulus that ranges from about 0.5 to about 6.5 GPa;
 a dielectric constant of about 2.5 and below; and
 a metal impurity level of about 500 ppm or less.

57. A low dielectric material, the material comprising:
 at least one silica having a plurality of Si—C bonds wherein the total number of the Si—C bonds to the total number of Si atoms ranges from about 20 to about 80 mole percent;
 an elastic modulus that ranges from about 1.3 to about 6.5 GPa; and
 a dielectric constant of about 1.95 and below.

58. The material of claim 57 wherein the material has a metal impurity content of about 500 ppm or less.

* * * * *